(12) United States Patent
Yagi

(10) Patent No.: US 10,896,732 B2
(45) Date of Patent: Jan. 19, 2021

(54) SEMICONDUCTOR MEMORY DEVICE

(71) Applicant: Toshiba Memory Corporation, Minato-ku (JP)

(72) Inventor: Mikiko Yagi, Ama (JP)

(73) Assignee: Toshiba Memory Corporation, Minato-ku (JP)

( * ) Notice: Subject to any disclaimer, the term of this patent is extended or adjusted under 35 U.S.C. 154(b) by 34 days.

(21) Appl. No.: 16/288,141

(22) Filed: Feb. 28, 2019

(65) Prior Publication Data

US 2020/0075100 A1 Mar. 5, 2020

(30) Foreign Application Priority Data

Sep. 4, 2018 (JP) .................................. 2018-165456

(51) Int. Cl.
| | |
|---|---|
| *H01L 29/792* | (2006.01) |
| *G11C 16/04* | (2006.01) |
| *H01L 27/11524* | (2017.01) |
| *H01L 27/11582* | (2017.01) |
| *H01L 27/1157* | (2017.01) |
| *H01L 27/11556* | (2017.01) |

(52) U.S. Cl.
CPC ...... *G11C 16/0408* (2013.01); *G11C 16/0466* (2013.01); *H01L 27/1157* (2013.01); *H01L 27/11524* (2013.01); *H01L 27/11556* (2013.01); *H01L 27/11582* (2013.01)

(58) Field of Classification Search
CPC ............ G11C 16/0408; G11C 16/0466; H01L 27/11524; H01L 27/11529; H01L 27/11556; H01L 27/1157; H01L 27/11582
USPC ........................................................ 257/324
See application file for complete search history.

(56) References Cited

U.S. PATENT DOCUMENTS

2012/0003800 A1 1/2012 Lee et al.
2018/0090511 A1* 3/2018 Nakajima ......... H01L 21/76897

FOREIGN PATENT DOCUMENTS

JP 2012-15517 1/2012

* cited by examiner

*Primary Examiner* — Calvin Y Choi
(74) *Attorney, Agent, or Firm* — Oblon, McClelland, Maier & Neustadt, L.L.P.

(57) ABSTRACT

A semiconductor memory device according to the embodiments includes a first laminated body, a second laminated body, an intermediate insulation layer, and a columnar body. The intermediate insulation layer is positioned between the first laminated body and the second laminated body. A plurality of conductive layers of the second laminated body include a first conductive layer which is positioned closest to the intermediate insulation layer among the plurality of conductive layers of the second laminated body. The first conductive layer has a main body part having a first end surface facing the columnar body, and a protrusion part which protrudes from the main body part to the first laminated body, and has a second end surface facing the columnar body. The first end surface and the second end surface are continuous with each other.

19 Claims, 22 Drawing Sheets

SEMICONDUCTOR MEMORY DEVICE

CROSS-REFERENCE TO RELATED APPLICATION

This application is based upon and claims the benefit of priority from Japanese Patent Application No. 2018-165456, Sep. 4, 2018; the entire contents of which are incorporated herein by reference.

FIELD

Embodiments of the present invention relate to a semiconductor memory device.

BACKGROUND

A NAND type flash memory in which memory cells are stacked in three dimensions is known.

DETAILED DESCRIPTION

Figure 1:
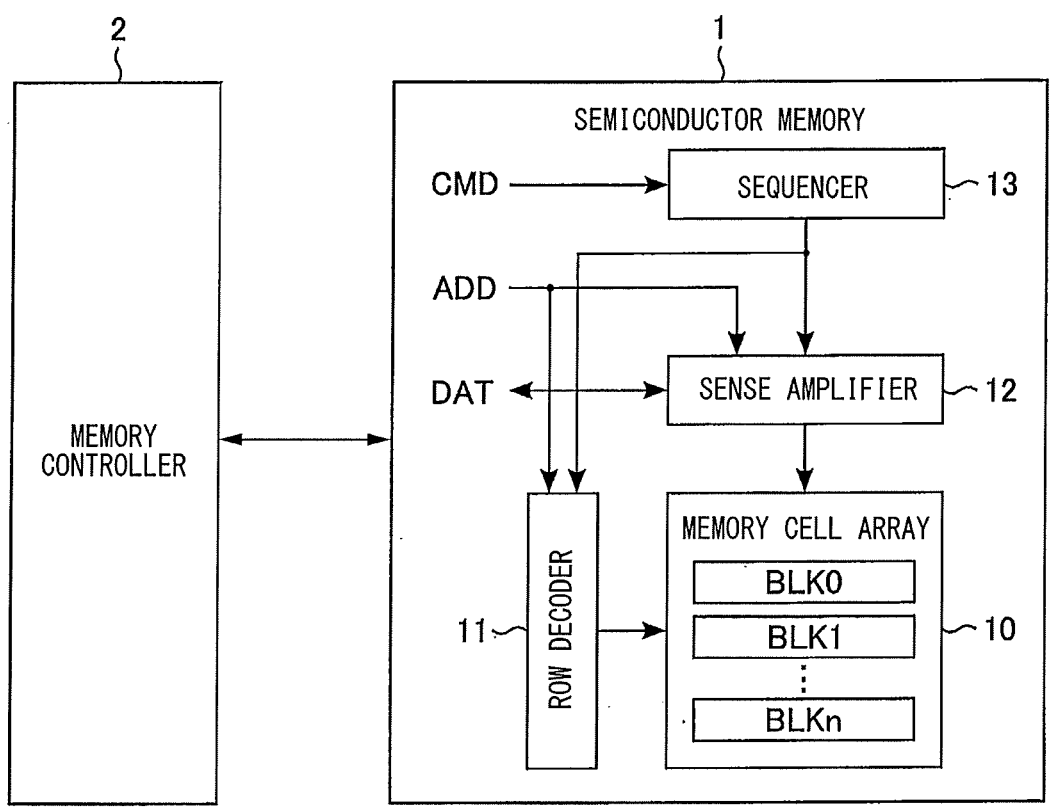
FIG. 1 is a block diagram which shows a system configuration of a semiconductor memory of a first embodiment.

A semiconductor memory device of the embodiments includes a first laminated body, a second laminated body, an intermediate insulation layer, and a columnar body. The first laminated body has a plurality of conductive layers and a plurality of insulation layers laminated in a first direction. The second laminated body is positioned on the first direction side with respect to the first laminated body, and the plurality of conductive layers and the plurality of insulation layers arc laminated in the first direction. The intermediate insulation layer is positioned between the first laminated body and the second laminated body, and has a thickness in the first direction thicker than that of one insulation layer included in the plurality of insulation layers of the first laminated body. The columnar body is provided to cross an inside of the first laminated body and an inside of the second laminated body. The columnar body includes a semiconductor body and a charge accumulation film. The plurality of conductive layers of the second laminated body includes a first conductive layer which is positioned closest to the intermediate insulation layer among the plurality of conductive layers of the second laminated body. The first conductive layer has a main body part and a protrusion part. The main body part extends in a second direction different from the first direction and has a first end surface facing the columnar body in the second direction. The protrusion part protrudes from the main body part to the first laminated body, and has a second end surface facing the columnar body in the second direction. The first end surface and the second end surface are continuous with each other.

Hereinafter, a semiconductor memory device according to embodiments will be described with reference to drawings. The drawings are schematic or conceptual, and a relationship between a thickness and a width of each part, the proportion of sizes between parts, and the like are not necessarily the same as actual ones. In the following description, components having the same or similar functions are denoted by the same reference signs. Then, duplicate descriptions of these configurations may be omitted in some cases. Numbers after letters in reference signs are referred to by reference signs including the same letter, and are used to distinguish elements having the same configuration. If there is no need to distinguish elements indicated by reference signs including the same letter, these elements are referred to by reference signs including only the same letter.

First, a +X direction, a −X direction, a +Y direction, a −Y direction, a +Z direction, and a −Z direction will be defined. The +X direction, the −X direction, the +Y direction, and the −Y direction are directions substantially parallel to a surface of a semiconductor substrate 20 (refer to FIG. 4) to be described below. The +X direction is a direction from one string unit SU0 to be described below to another string unit SU1 (refer to FIG. 3). The −X direction is a direction opposite to the +X direction. When the +X direction and the −X direction are not distinguished from each other, they are simply referred to as an "X direction." The +Y direction and the −Y direction are directions intersecting (for example, substantially orthogonal to) the X direction. The +Y direction and the −Y direction are opposite to each other. When the +Y direction and the −Y direction are not distinguished from each other, they are simply referred to as a "Y direction." The +Z direction and the −Z direction are directions intersecting (for example, substantially orthogonal to) the X direction and the Y direction. The +Z direction is a direction from a first laminated body 30A to a second laminated body 30B to be described below (refer to FIG. 4). The −Z direction is a direction opposite to the +Z direction. When the +Z direction and the −Z direction are not distinguished from each other, they are simply referred to as a "Z direction." In the present specification, the "+Z direction" may be referred to as "upward" and the "−Z direction" may be referred to as "downward." However, these expressions are for convenience only, and do not define the direction of gravity. In the present embodiment, the +Z direction is an example of the "first direction." The +X direction is an example of the "second direction."

A term of "connection" in the present specification is not limited to a case of being physically connected, and includes a case of being electrically connected. In the present specification, "facing," "overlapping," and "being adjacent to" are not limited to a case of two members being in contact with each other, and include a case of another member being present between two members. In the present specification, "extending in an A direction" means, for example, that a size in the A direction is larger than a minimum size among respective sizes in the X direction, the Y direction, and the Z direction. The "A direction" is an arbitrary direction. In addition, a "width in the A direction" in the present specification means a width in the A direction in a cross section substantially parallel to the X direction, which passes through a central axis C or the vicinity of the central axis C of the columnar body 40 in the Z direction (refer to FIG. 4).

The "central axis C of the columnar body 40" means an imaginary axis passing through centers in the X direction and the Y direction of the columnar body 40 in the Z direction.

First Embodiment

First, an overall configuration of a semiconductor memory device (semiconductor memory) of the present embodiment will be described.

A semiconductor memory 1 of the present embodiment is a non-volatile semiconductor memory device, and is, for example, a NAND-type flash memory.

FIG. 1 is a block diagram which shows a system configuration of a semiconductor memory 1. The semiconductor 1 includes, for example, a memory cell array 10, a row decoder 11, a sense amplifier 12, and a sequencer 13.

The memory cell array 10 includes a plurality of blocks BLK0 to BLKn (n is an integer of 1 or more). A block BLK is a set of non-volatile memory cell transistors MR (refer to FIG. 2). A plurality of bit lines and a plurality of word lines are provided in the memory cell array 10. Each memory cell transistor MT is associated with one bit line and one word line. The detailed configuration of the memory cell array 10 will be described below.

The row decoder 11 selects one block BLK on the basis of address information ADD received from an external memory controller 2. The row decoder 11 controls a write operation and a read operation of data to and from the memory cell array 10 by applying desired voltages to a plurality of word lines, respectively.

The sense amplifier 12 applies a desired voltage to each bit line in accordance with write data DAT received from the memory controller 2. The sense amplifier 12 determines data stored in a memory cell transistor MT on the basis of a voltage of a bit line, and transmits determined read data DAT to the memory controller 2.

The sequencer 13 controls operations of the entire semiconductor memory 1 on the basis of a command CMD received from the memory controller 2.

The semiconductor memory 1 and the memory controller 2 described above may be combined to constitute one semiconductor device. The semiconductor device includes, for example, a memory card such as a SD (registered trademark) card, a solid state drive (SSD), and the like.

Next, an electrical configuration of the memory cell array 10 will be described.

Figure 2:
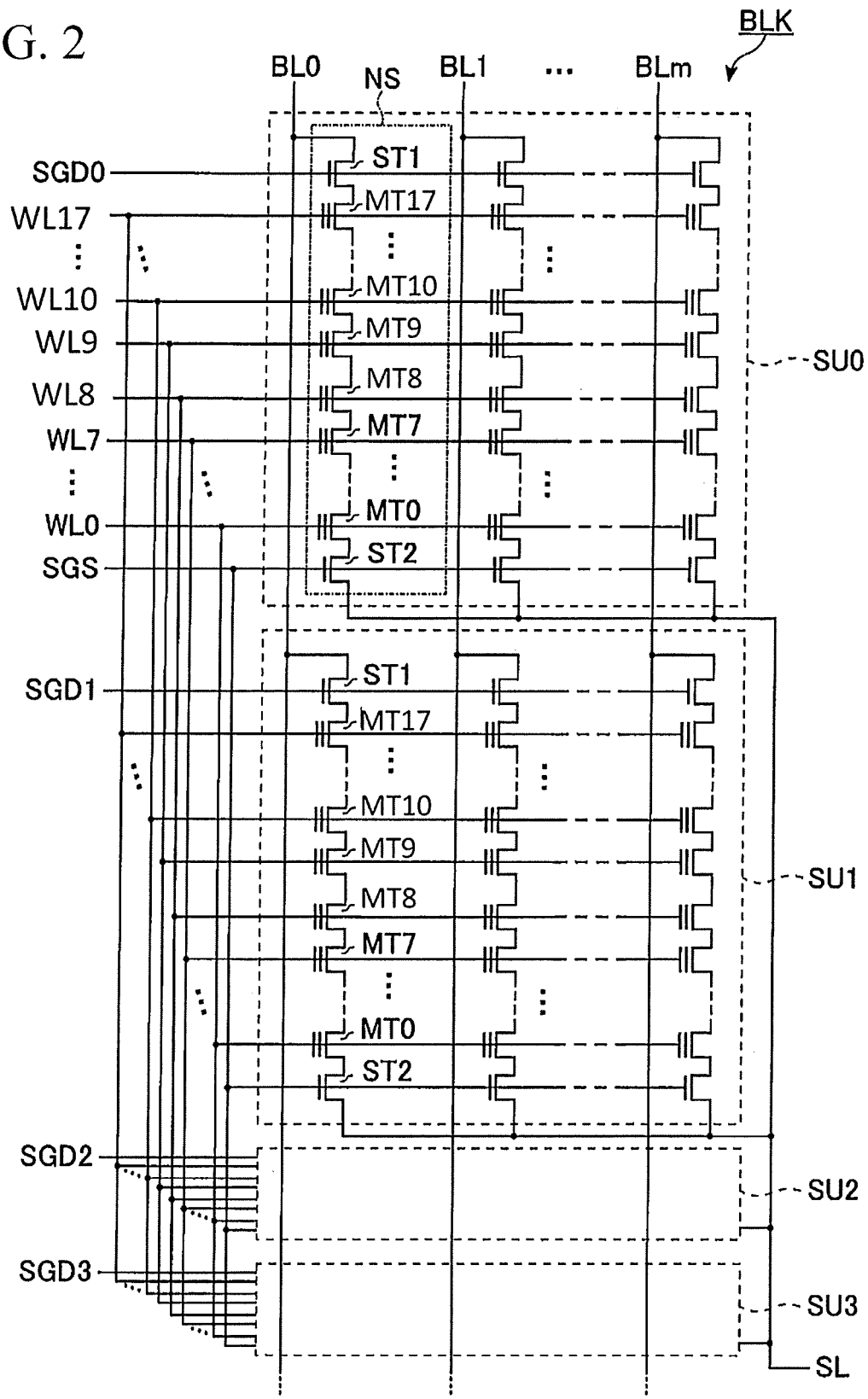
FIG. 2 is a diagram which shows an equivalent circuit of a memory cell array of the first embodiment.

FIG. 2 is a diagram which shows an equivalent circuit of the memory cell array 10, and shows an extracted block BLK. The block BLK includes a plurality (for example, 4) of string units SU (SU0 to SU3).

Each string unit SU is an assembly of a plurality of NAND strings NS. One end of each NAND string NS is connected to a bit line BL (any one of BL0 to BLm (m is an integer of 1 or more)). The other end of the NAND strings NS is connected to a source line SL. Each NAND string NS includes a plurality (for example, 18) of memory cell transistors MT (MT0 to MT17), a first selection transistor ST1, and a second selection transistor ST2.

The plurality of memory cell transistors MT (MT0 to MT17) are electrically connected to each other in series. The memory cell transistor MT includes a control gate and a charge accumulation film, and stores data in a non-volatile manner. The memory cell transistor MT accumulates charge in the charge accumulation film in accordance with a voltage applied to the control gate. The control gate of the memory cell transistor MT is connected to a corresponding word line WL (any one of the WL0 to WL17). The memory cell transistor MT is electrically connected to the row decoder 11 via a word line WL.

The first selection transistor ST1 is connected between the plurality of memory cell transistors MT (MT0 to MT17) and a corresponding bit line BL. A drain of the first selection transistor ST1 is connected to the bit line BL. A source of the first selection transistor ST1 is connected to the plurality of memory cell transistors MT. A control gate of the first selection transistor ST1 is connected to a corresponding selected gate line SGD (any one of SGD0 to SGD3). The first selection transistor ST1 is electrically connected to the row decoder 11 via a selected gate line SGD. When a predetermined voltage is applied to the selected gate line SGD, the first selection transistor ST1 is connected to a NAND string NS and a bit line BL.

The second selection transistor ST2 is connected between the plurality of memory cell transistors MT (MT0 to MT17) and the source line SL. A drain of the second selection transistor ST2 is connected to the plurality of memory cell transistors MT. A source of the second selection transistor ST2 is connected to the source line SL. A control gate of the second selection transistor ST2 is connected to the selected gate line SGS. The second selection transistor ST2 is electrically connected to the row decoder 11 via the selected gate line SGS. When a predetermined voltage is applied to the selected gate line SGS, the second selection transistor ST2 is connected to a NAND string NS and the source line SL.

Next, a physical configuration of the memory cell array 10 will be described.

Figure 3:
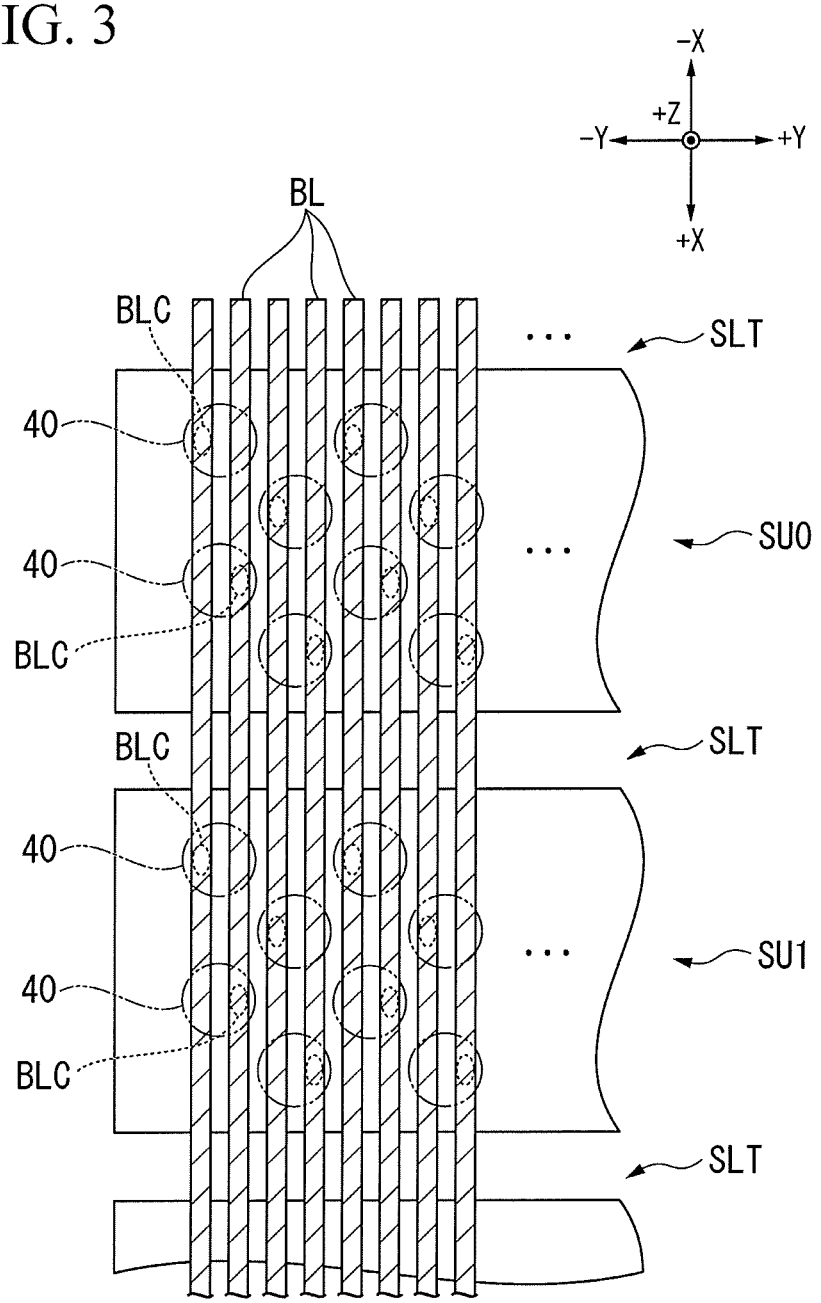
FIG. 3 is a plan view which shows a partial region of the memory cell array of the first embodiment.

FIG. 3 is a plan view which shows a partial region of the memory cell array 10. For example, a plurality of string units SU are arranged in the X direction, and extend in the Y direction. The plurality of string units SU are separated from each other by a slit SLT filled with an insulating material. Each string unit SU includes a plurality of columnar bodies 40 extending in the Z direction. Each columnar body 40 is connected to one bit line BL via a contact plug BLC to be described below. For example, the bit line BL extends in the X direction.

Figure 4:
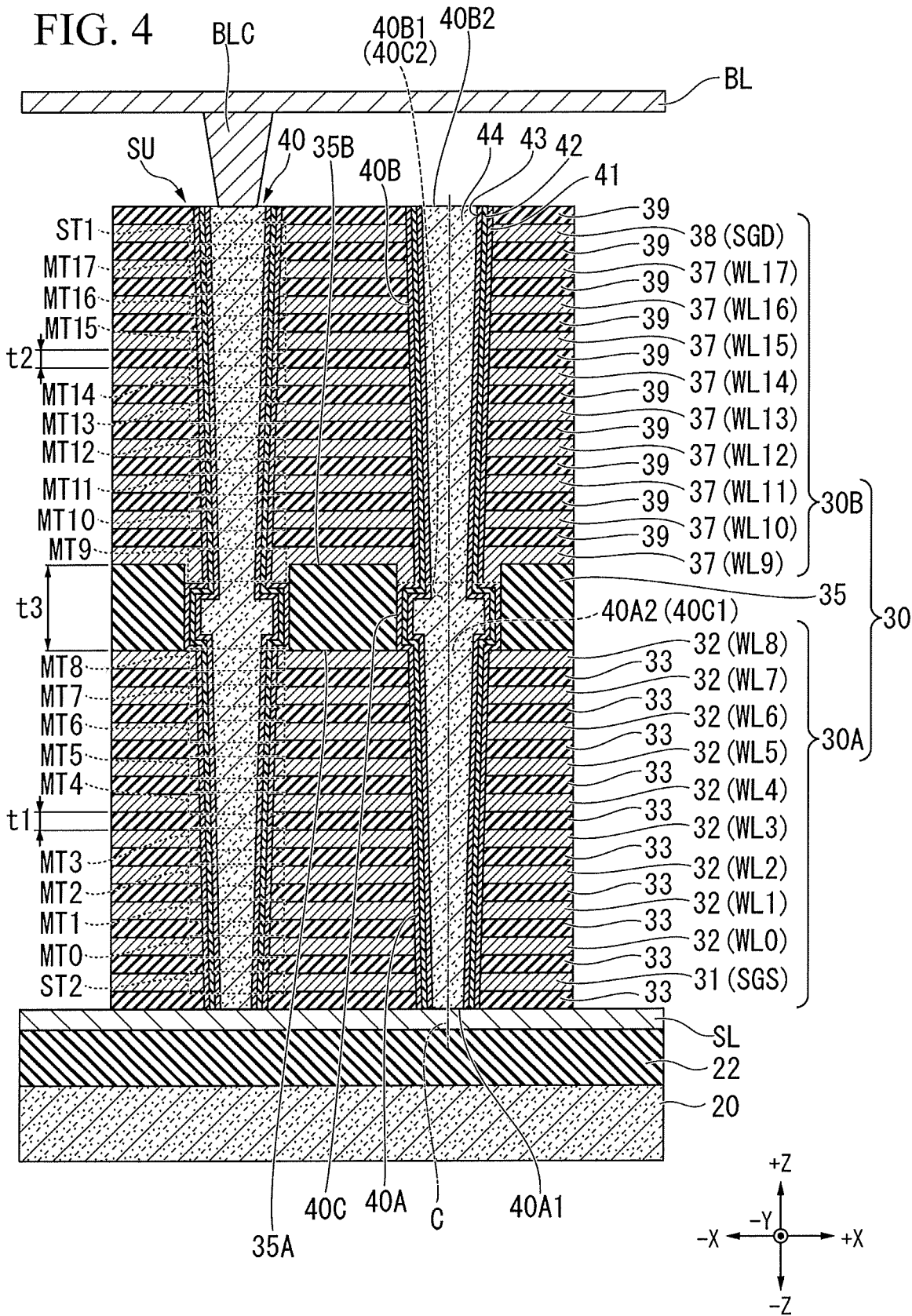
FIG. 4 is a cross-sectional view which shows a partial region of the memory cell array of the first embodiment.

FIG. 4 is a cross-sectional view which shows a partial region of the memory cell array 10. The memory cell array 10 includes, for example, a semiconductor substrate 20, an insulation layer 22, the source line SL, a laminated body 30, a columnar body 40, the contact plug BLC, and the bit line BL.

The semiconductor substrate 20 has a surface along the X direction and the Y direction. The insulation layer 22 is provided on the semiconductor substrate 20. A drive circuit including a complementary MOS (CMOS) and the like is provided inside the insulation layer 22. The source line SL which is a conductor is provided on the insulation layer 22. The source line SL is formed in a plate shape substantially parallel to the X direction and the Y direction.

The laminated body 30 is provided on the source line SL. The laminated body 30 includes a first laminated body 30A, an intermediate insulation layer 35, and a second laminated body 30B.

The first laminated body 30A includes one conductive layer 31, a plurality of conductive layers 32, and a plurality of insulation layers 33. In the first laminated body 30A, the plurality of conductive layers 31 and 32 and the plurality of insulation layers 33 are laminated in a Z direction. The conductive layer 31 functions as a selected gate line SGS. The plurality of conductive layers 32 are positioned above the conductive layer 31, and function as word lines WL0 to WL8, respectively. The insulation layers 33 are provided between the conductive layer 31 and the conductive layer 32, and between the plurality of conductive layers 32, respectively. Each of the conductive layers 31 and 32, and an insulation layer 33 is formed in a plate shape along the X direction and the Y direction.

The second laminated body 30B is positioned above the first laminated body 30A. The second laminated body 30B includes a plurality of conductive layers 37, one conductive layer 38, and a plurality of insulation layers 39. The plurality of conductive layers 37 and 38 and the plurality of insulation layers 39 are laminated in the Z direction in the second laminated body 30B. The plurality of conductive layers 37 function as word line WL9 to WL17, respectively. The conductive layer 38 is positioned above the plurality of conductive layers 37, and functions as the selected gate line SGD. The insulation layers 39 are provided between the plurality of conductive layers 37 and between the conductive layer 37 and the conductive layer 38, respectively. Each of the conductive layers 37 and 38, and the insulation layer 39 is formed in a plate shape along the X direction and the Y direction.

The intermediate insulation layer 35 is positioned between the first laminated body 30A and the second laminated body 30B in the Z direction. The thickness (for example, a maximum thickness) t3 of the intermediate insulation layer 35 in the Z direction is thicker than a thickness t1 of any one insulation layer 33 included in the first laminated body 30A in the Z direction, and is thicker than a thickness t2 of any one insulation layer 39 included in the second laminated body 30B in the Z direction. A "thickness t3 of the intermediate insulation layer 35" is a distance between a lower surface 35A of the intermediate insulation layer 35 in contact with the uppermost conductive layer 32 included in the first laminated body 30A and an upper surface 35B of the intermediate insulation layer 35 in contact with the lowermost conductive layer 37 included in the second laminated body 30B.

The columnar body 40 functions as, for example, one NAND string NS. The columnar body 40 is provided in the laminated body 30 in the Z direction, and leads to the inside of the first laminated body 30A from at least the inside of the second laminated body 30B by penetrating the intermediate insulation layer 35. A lower end of the columnar body 40 is connected to the source line SL. An upper end of the columnar body 40 is connected to the bit line BL via the contact plug BLC. The contact plug BLC means a connecting member of a columnar shape or an inverse truncated cone shape, which is formed from a conductive material. In the present embodiment, the columnar body 40 includes a first columnar part 40A, a second columnar part 40B, and a junction 40C.

The first columnar part 40A is provided at least in the first laminated body 30A, and extends in the Z direction in the first laminated body 30A. The first columnar part 40A has a lower end 40A1 and an upper end 40A2. The lower end 40A1 is connected to the source line SL. The upper end 40A2 is connected to the junction 40C. The first columnar part 40A and the junction 40C are integrally formed, and there is no substantial boundary surface between the first columnar part 40A and the junction 40C. For example, the first columnar part 40A gradually decreases in width in the X direction and the Y direction as proceeding toward the lower end 40A1 from the upper end 40A2.

The second columnar part 40B is provided at least in the second laminated body 30B, and extends in the second laminated body 30B in the Z direction. The second columnar part 40B has a lower end 40B1 and an upper end 40B2. The lower end 40B1 is connected to the junction 40C. The upper end 40B2 is connected to the contact plug BLC. The second columnar part 40B and the junction 40C are integrally formed, and there is no substantial boundary surface between the second columnar part 40B and the junction 40C. The width of the second columnar part 40B gradually decreases in the X direction and the Y direction as proceeding toward the lower end 40B1 from the upper end 40B2.

The junction 40C is positioned between the first columnar part 40A and the second columnar part 40B. The junction 40C has a lower end 40C1 in contact with the upper end 40A2 of the first columnar part 40A, and an upper end 40C2 in contact with the lower end 40B1 of the second columnar part 40B. The widths of the lower end 40C1 of the junction 40C in the X direction and the Y direction are larger than widths of the upper end 40A2 of the first columnar part 40A in the X direction and the Y direction. Widths of the upper end 40C2 of the junction 40C in the X direction and the Y direction are larger than widths of the lower end 40B1 of the second columnar part 40B in the X direction and the Y direction.

The columnar body 40 includes a block insulation film 41, an insulation film 42, a tunnel oxide film 43, and a semiconductor body 44. The block insulation film 41 is provided in an inner wall of a memory hole which is a hole penetrating the laminated body 30 in the Z direction. The insulation film 42 is provided in an inner wall of the block insulation film 41. The insulation film 42 functions as a charge accumulation film. The tunnel oxide film 43 is provided in an inner wall of the insulation film 42. The semiconductor body 44 is provided in an inner wall of the tunnel oxide film 43. The block insulation film 41, the insulation film 42, the tunnel oxide film 43, and the semiconductor body 44 are continuously provided from the first columnar part 40A to the second columnar part 40B via the junction 40C along an outer surface of the columnar body 40. Note that the columnar body 40 may contain different part which contains different materials with the semiconductor body 44 inside of the semiconductor body 44.

In the semiconductor memory 1 having such a configuration, intersection portions between the columnar body 40 and conductive layers 31, 32, 37, and 38 of the first laminated body 30A and the second laminated body 30B function as transistors, respectively. For example, the intersection portion between the columnar body 40 and the conductive layer 38 functions as the first selection transistor ST1. An intersection portion between the columnar body 40 and the conductive layer 31 functions as the second selection transistor ST2. The intersection portions between the columnar body 40 and the plurality of conductive layers 32 and 38 function as memory cell transistors MT (MT0 to MT17), respectively.

Figure 5:
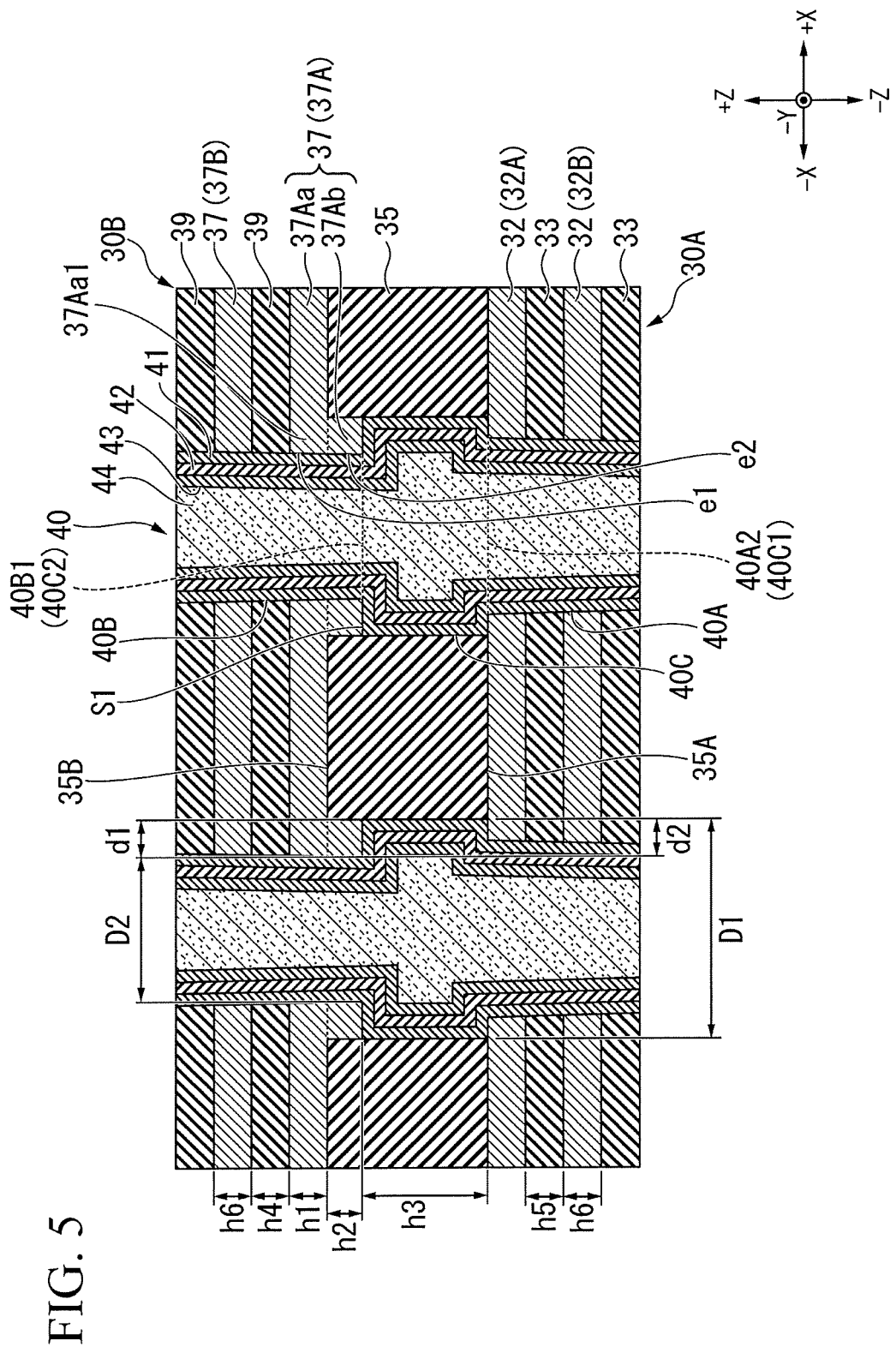
FIG. 5 is a cross-sectional view which shows a region near a junction of the memory cell array of the first embodiment.

FIG. 5 is a cross-sectional view which shows an enlarged region near the junction 40C of the memory cell array 10. In the following description, the conductive layer 37 which is positioned closest to the intermediate insulation layer 35 among the plurality of conductive layers 37 included in the second laminated body 30B is referred to as a "first conductive layer 37A." A conductive layer 37 which is positioned second closest to the intermediate insulation layer 35 after the first conductive layer 37A among the plurality of conductive layers 37 included in the second laminated body 30B is referred to as a "second conductive layer 37B." On the other hand, a conductive layer 32 which is positioned closest to the intermediate insulation layer 35 among the plurality of conductive layers 32 included in the first laminated body 30A is referred to as a "third conductive layer 32A." A conductive layer 32 which is positioned second closest to the intermediate insulation layer 35 after the third conductive layer 32A among the plurality of conductive layers 32 included in the first laminated body 30A is referred to as a "fourth conductive layer 32B."

In the present embodiment, the first conductive layer 37A is different in shape from other conductive layers 32 and 37. Specially, the first conductive layer 37A has a main body part 37Aa and a protrusion part 37Ab. The main body part 37Aa is an example of a first part. The protrusion part 37Ab is an example of a second part.

The main body part 37Aa is formed in a plate shape along the upper surface 35B of the intermediate insulation layer 35, and extends in the X direction and the Y direction. The main body part 37Aa is in contact with the intermediate insulation layer 35 in the Z direction.

The main body part 37Aa has, for example, a first end 37Aa1 adjacent to the second columnar part 40B in the X direction and the Y direction. The first end 37Aa1 of the main body part 37Aa is a part closer to the second columnar part 40B than to a surface extending from a side surface in the X direction of the junction 40C in the Z direction. At least a part of the first end 37Aa1 is in contact with the second columnar part 40B in the X direction and the Y direction. In the present embodiment, the first end 37Aa1 is in contact with the second columnar part 40B in the X direction and the Y direction over an entire thickness of the main body part 37Aa in the Z direction. The first end 37Aa1 has, for example, a first end surface e1 facing the second columnar part 40B in the X direction.

The protrusion part 37Ab protrudes from the first end 37Aa1 of the main body part 37Aa to the first laminated body 30A. The protrusion part 37Ab protrudes closer to the first laminated body 30A than a part of the intermediate insulation layer 35 (for example, a part in the vicinity of the upper surface 35B) does in the Z direction. In the present embodiment, the protrusion part 37Ab is formed in an annular shape surrounding a lower end of the second columnar part 40B. The protrusion part 37Ab has, for example, a second end surface e2 facing the second columnar part 40B in the X direction. The second end surface e2 of the protrusion part 37Ab and the first end surface e1 of the main body part 37Aa are continuous with each other. "The second end surface e2 of the protrusion part 37Ab and the first end surface e1 of the main body part 37Aa being continuous with each other" means that "there is no substantial shift (step difference) in the X direction or the Y direction between the second end surface e2 of the protrusion part 37Ab and the first end surface e1 of the main body part 37Aa".

At least a part of the protrusion part 37Ab is in contact with the second columnar part 40B in the X direction and the Y direction. In the present embodiment, the protrusion part 37Ab is in contact with the second columnar part 40B in the X direction and the Y direction over an entire length (total protrusion length) of the protrusion part 37Ab in the Z direction. In the present embodiment, a contact area between the first conductive layer 37A and the second columnar part 40B is larger than a contact area between the second conductive layer 37B and the second columnar part 40B, and is also larger than a contact area between the third conductive layer 32A and the first columnar part 40A.

In the present embodiment, the protrusion part 37Ab has a region overlapping a part of the junction 40C in the Z direction as viewed from the Z direction. For example, the protrusion part 37Ab is in contact with the upper end 40C2 of the junction 40C in the Z direction. According to another expression, the protrusion part 37Ab is in contact with the upper end 40C2 of the junction 40C from a side opposite to the first laminated body 30A. The upper end 40C2 of the junction 40C is not in contact with the intermediate insulation layer 35 but in contact with the protrusion part 37Ab.

In the present embodiment, the second columnar part 40B and the junction 40C form a step difference S1 at a boundary between the second columnar part 40B and the junction 40C. The step difference S1 is based on, for example, a difference between a width D2 of the lower end 40B1 of the second columnar part 40B in the X direction and a width D1 of the upper end 40C2 of the junction 40C in the X direction. In the present embodiment, a maximum width d1 of the protrusion part 37Ab in the X direction is equal to or smaller than a width d2 of the step difference S1 in the X direction. "The width d2 of the step difference S1 in the X direction" is a difference obtained by subtracting a half of the width D2 of the lower end 40B1 of the second columnar part 40B in the X direction from half of the width D1 of the upper end 40C2 of the junction 40C in the X direction.

In addition, in the present embodiment, the maximum width d1 of the protrusion part 37Ab in the X direction is equal to or smaller than a thickness h1 of the main body part 37Aa in the Z direction. In another viewpoint, the width d2 of the step difference S1 in the X direction is equal to or smaller than the thickness h1 of the main body part 37Aa in the Z direction.

In the present embodiment, for example, a protrusion length h2 of the protrusion part 37Ab in the Z direction is equal to or larger than the thickness h1 of the main body part 37Aa in the Z direction. For example, the protrusion length h2 of the protrusion part 37Ab in the Z direction may be larger than the thickness h1 of the main body part 37Aa in the Z direction. The protrusion length h2 of the protrusion part 37Ab in the Z direction may also be smaller than the thickness h1 of the main body part 37Aa in the Z direction. The thickness h1 of the main body part 37Aa is substantially the same as thicknesses h6 of other conductive layers 32 and 37.

In the present embodiment, a shortest distance h3 between the protrusion part 37Ab and the third conductive layer 32A in the Z direction is substantially equal to or larger than a shortest distance h4 between the first conductive layer 37A and the second conductive layer 37B in the Z direction, and is substantially equal to or larger than a shortest distance h5 between the third conductive layer 32A and the fourth conductive layer 32B in the Z direction. "A shortest distance h3 between the protrusion part 37Ab and the third conductive layer 32A in the Z direction" means the distance between a protrusion end (the lowermost end) of the protrusion part 37Ab and the third conductive layer 32A.

The configurations of other memory cell arrays 10 are described in, for example, U.S. patent application Ser. No. 12/407,403 filed on Mar. 19, 2009 entitled as "Three-dimensional laminated non-volatile semiconductor memory," U.S. patent application Ser. No. 12/406,524 filed on Mar. 18, 2009 entitled as "Three-dimensional laminated non-volatile semiconductor memory," U.S. patent application Ser. No. 12/679,991 filed on Mar. 25, 2010 entitled as "Non-volatile semiconductor memory device and a manufacturing method thereof," and U.S. patent application Ser. No. 12/532,030 filed on Mar. 23, 2009 entitled as "Semiconductor memory and a manufacturing method thereof," respectively. These patent applications are incorporated into the present specification by reference in their entirety.

Next, an example of a manufacturing method of the memory cell array 10 will be described.

Figure 6:
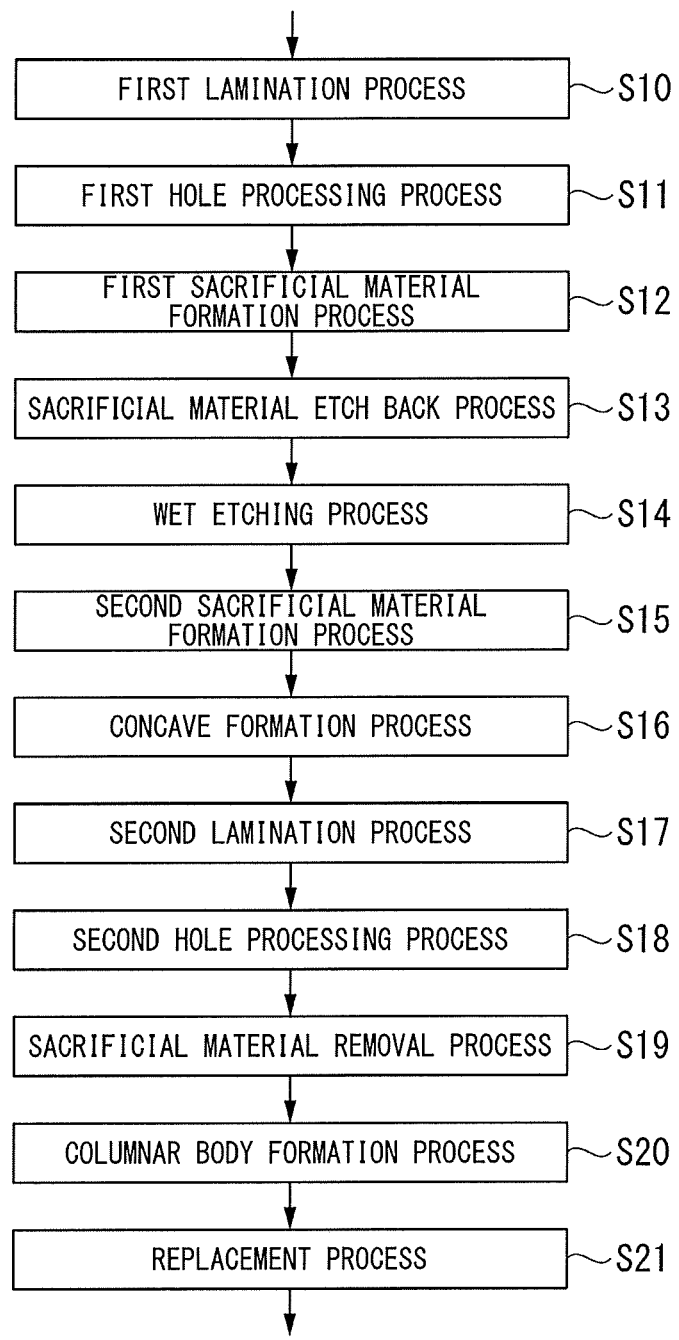
FIG. 6 is a process chart which shows a manufacturing method of the memory cell array of the first embodiment.

FIG. 6 shows an example of the manufacturing method of the memory cell array 10. FIGS. 7 to 19 are cross-sectional views which show each manufacturing process of the memory cell array 10. In the following description, a substitution material or insulator lamination process to a process in which a word line WL is formed will be described.

Figure 7:
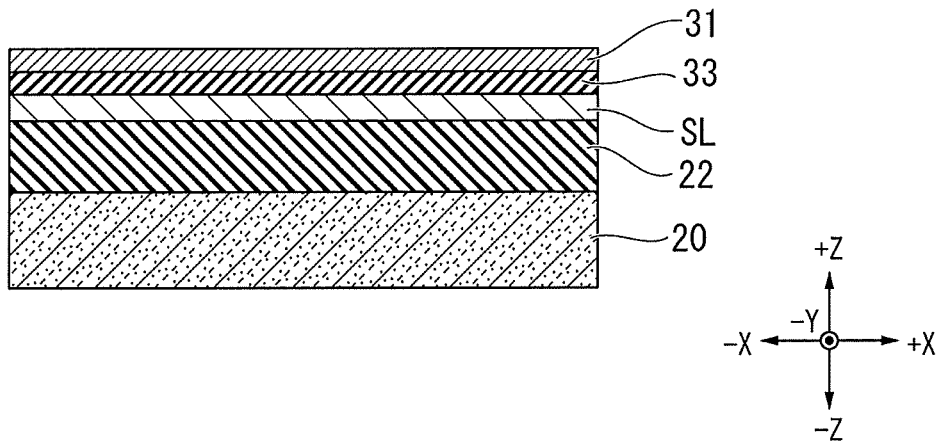
FIG. 7 is a cross-sectional view which shows an example of a manufacturing process of the memory cell array of the first embodiment.

FIG. 7 is a cross-sectional view which corresponds to a process previous to the first lamination process shown in FIG. 6. In the previous process, the insulation layer 22 and the source line SL are formed on the semiconductor substrate 20. A drive circuit including a CMOS and the like is formed in the insulation layer 22. In addition, one insulation layer 33 and one conductive layer 31 are laminated on the source line SL.

Figure 8:
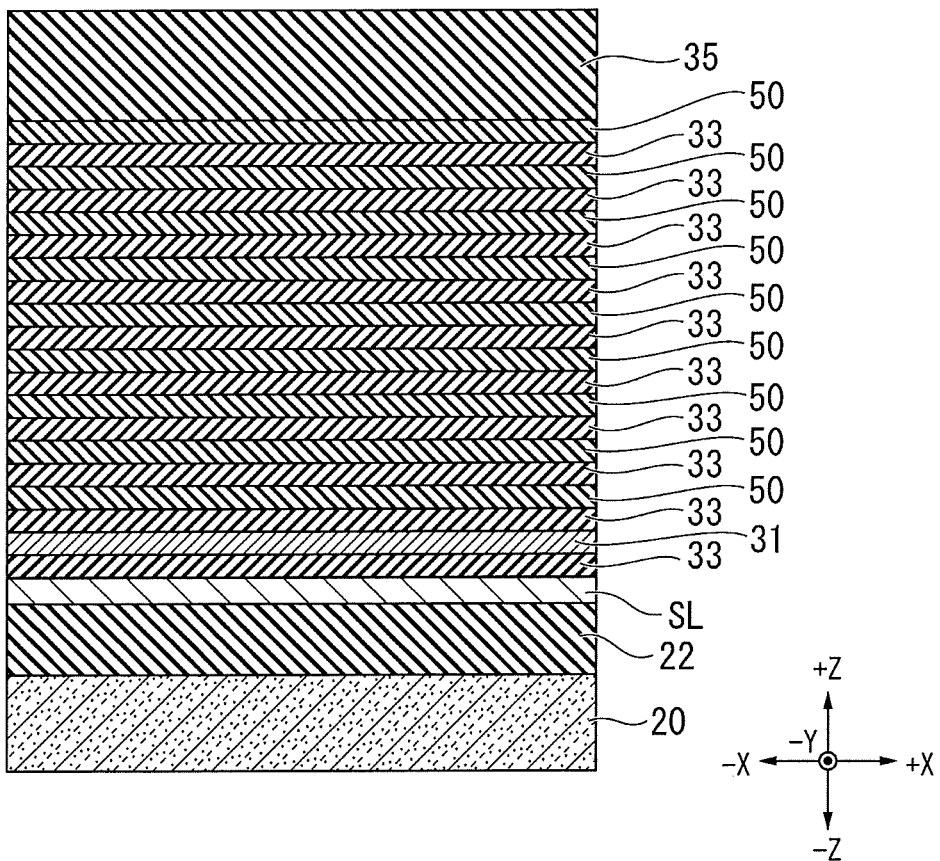
FIG. 8 is a cross-sectional view which shows an example of the manufacturing process of the memory cell array of the first embodiment.

FIG. 8 is a cross-sectional view which corresponds to the first lamination process (S10) shown in FIG. 6. In the first lamination process, the insulation layer 33 and a substitution material 50 are alternately laminated on the conductive layer 31. The substitution material 50 is a nitride film of, for example, silicon nitride (SiN) or the like. The intermediate insulation layer 35 is laminated on the uppermost substitution material 50.

Figure 9:
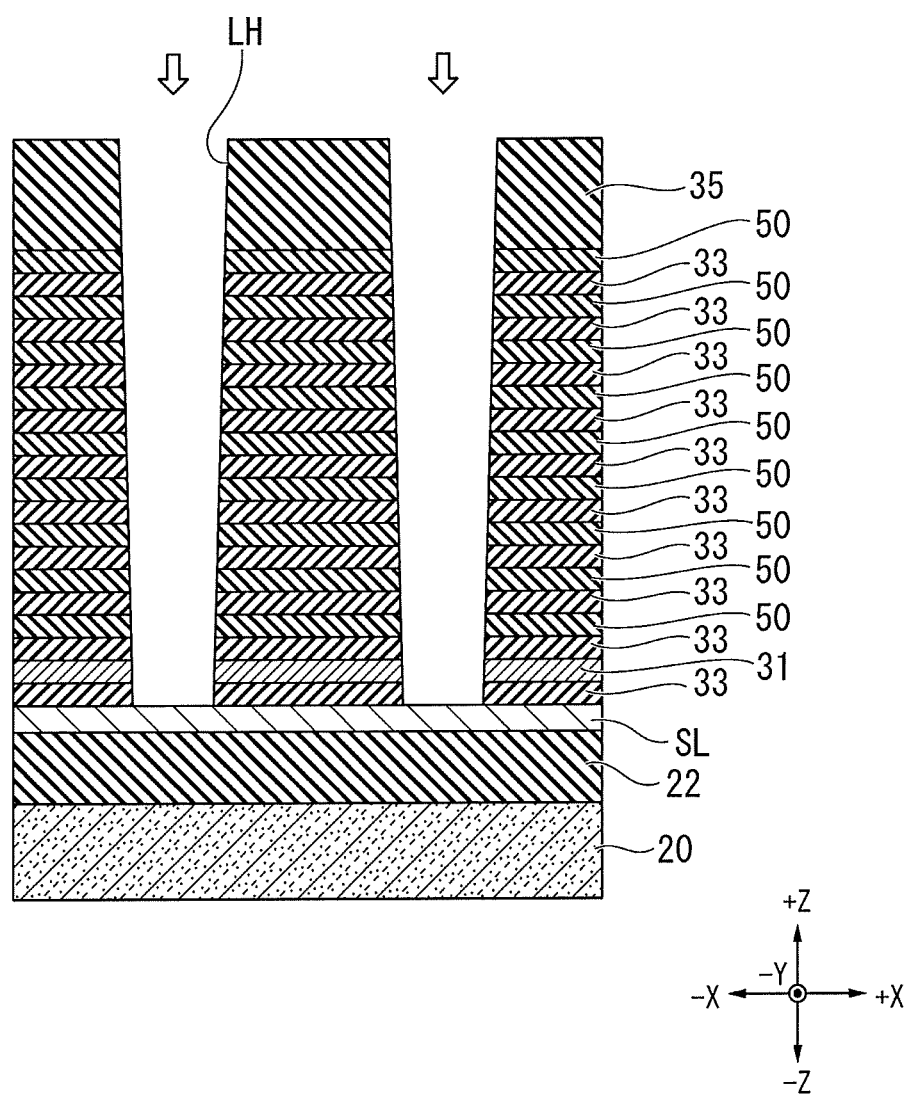
FIG. 9 is a cross-sectional view which shows an example of the manufacturing process of the memory cell array of the first embodiment.

FIG. 9 is a cross-sectional view which corresponds to a first hole processing process (S11) shown in FIG. 6. In the first hole processing process, a hole LH is processed in a laminated body laminated in the process of FIG. 8. The hole LH is processed by photolithography and anisotropic etching. For example, reactive ion etching (RIE) can be used for anisotropic etching.

Figure 10:
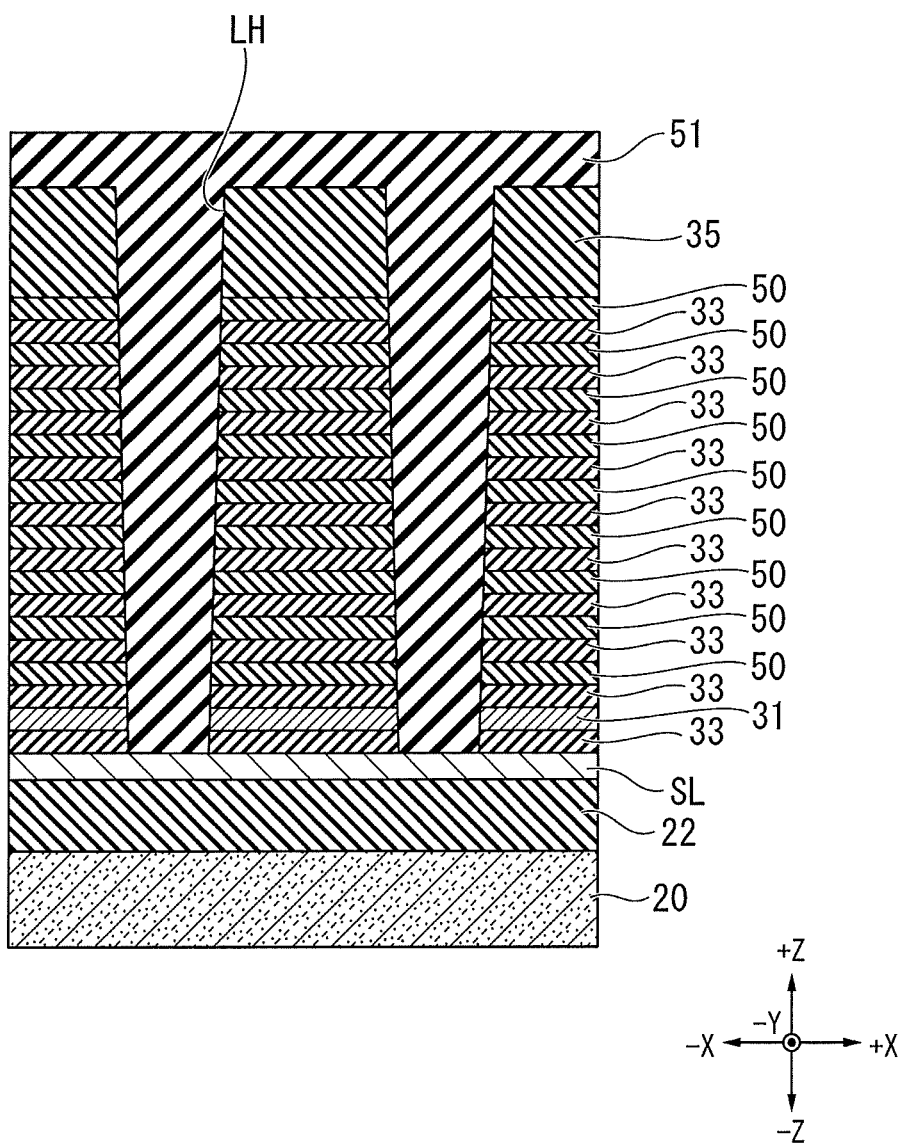
FIG. 10 is a cross-sectional view which shows an example of the manufacturing process of the memory cell array of the first embodiment.

FIG. 10 is a cross-sectional view which corresponds to a first sacrificial material formation process (S12) shown in FIG. 6. In the first sacrificial material formation process, a sacrificial material 51 is formed inside the hole LH and on the intermediate insulation layer 35. The sacrificial material 51 is, for example, amorphous silicon (aSi).

Figure 11:
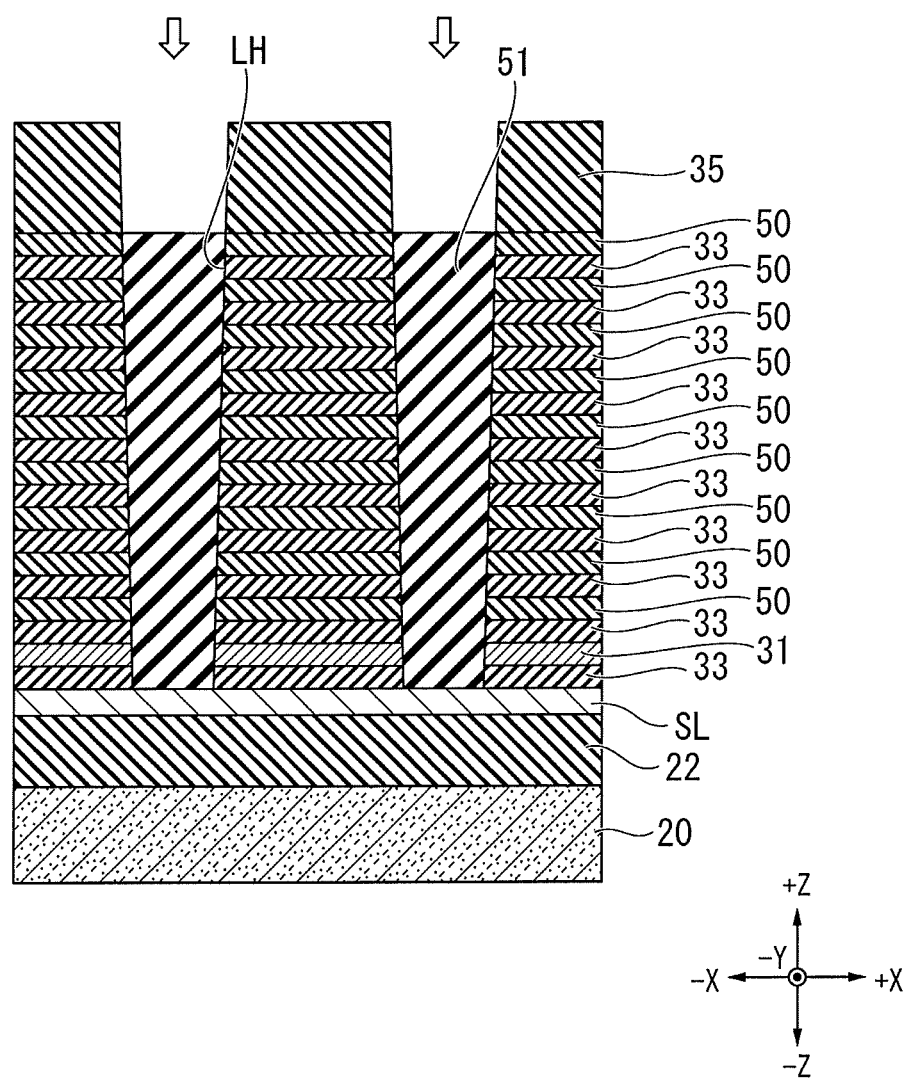
FIG. 11 is a cross-sectional view which shows an example of the manufacturing process of the memory cell array of the first embodiment.

FIG. 11 is a cross-sectional view which corresponds to a sacrificial material etch back process (S13) shown in FIG. 6. In the sacrificial material etch back process, the sacrificial material 51 is etched back by RIE and an unnecessary part of the sacrificial material 51 is removed.

Figure 12:
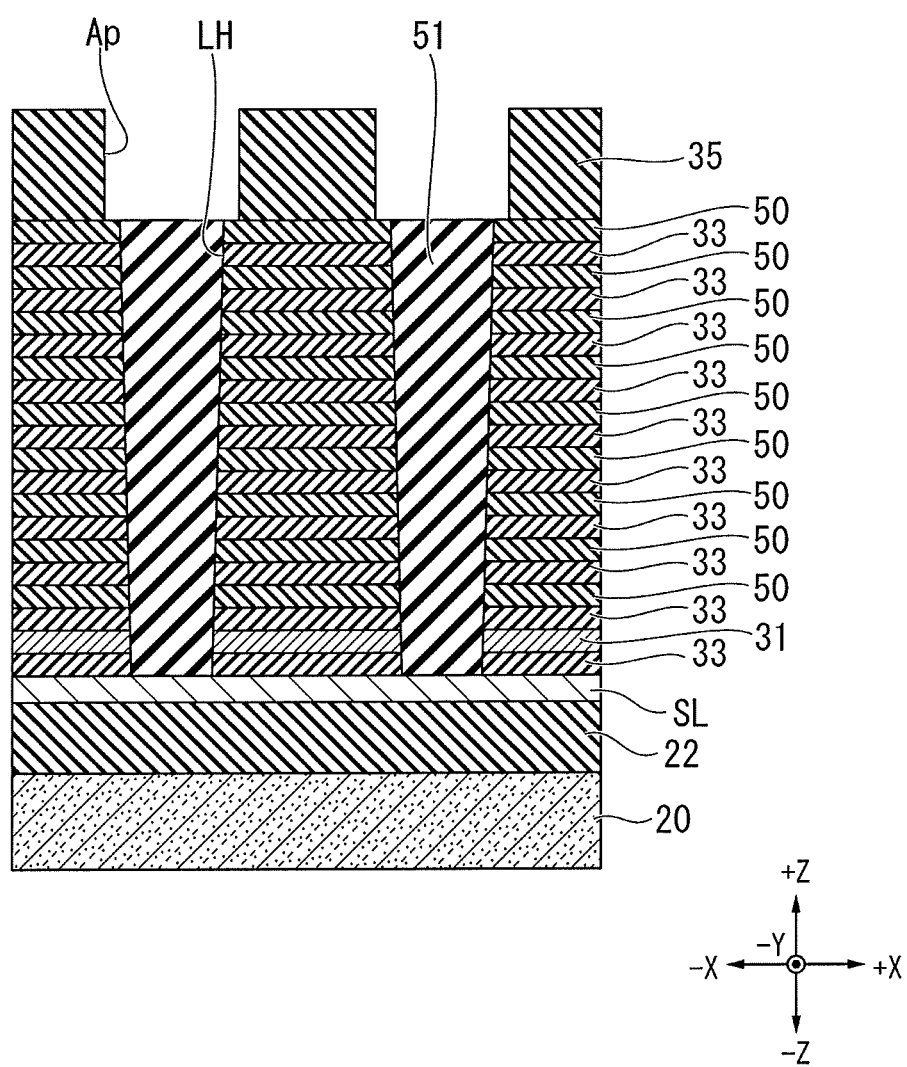
FIG. 12 is a cross-sectional view which shows an example of the manufacturing process of the memory cell array of the first embodiment.

FIG. 12 is a cross-sectional view which corresponds to a wet etching process (S14) shown in FIG. 6. In the wet etching process, the intermediate insulation layer 35 is processed by wet etching, and a part (opening Ap) obtained by removing the sacrificial material 51 in the intermediate insulation layer 35 expands.

Figure 13:
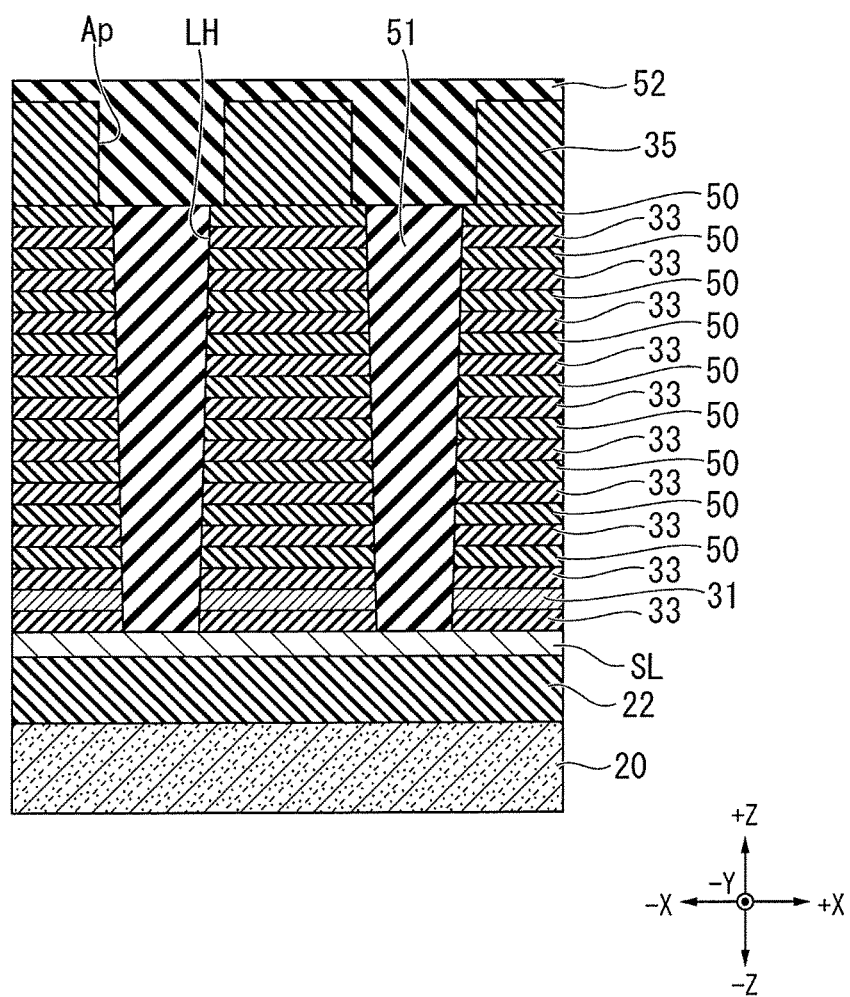
FIG. 13 is a cross-sectional view which shows an example of the manufacturing process of the memory cell array of the first embodiment.

FIG. 13 is a cross-sectional view which corresponds to a second sacrificial material formation process (S15) shown in FIG. 6. In the second sacrificial material formation process, a sacrificial material 52 is formed inside the opening Ap of the hole LH and on the intermediate insulation layer 35. The sacrificial material 52 is, for example, amorphous silicon (aSi).

Figure 14:
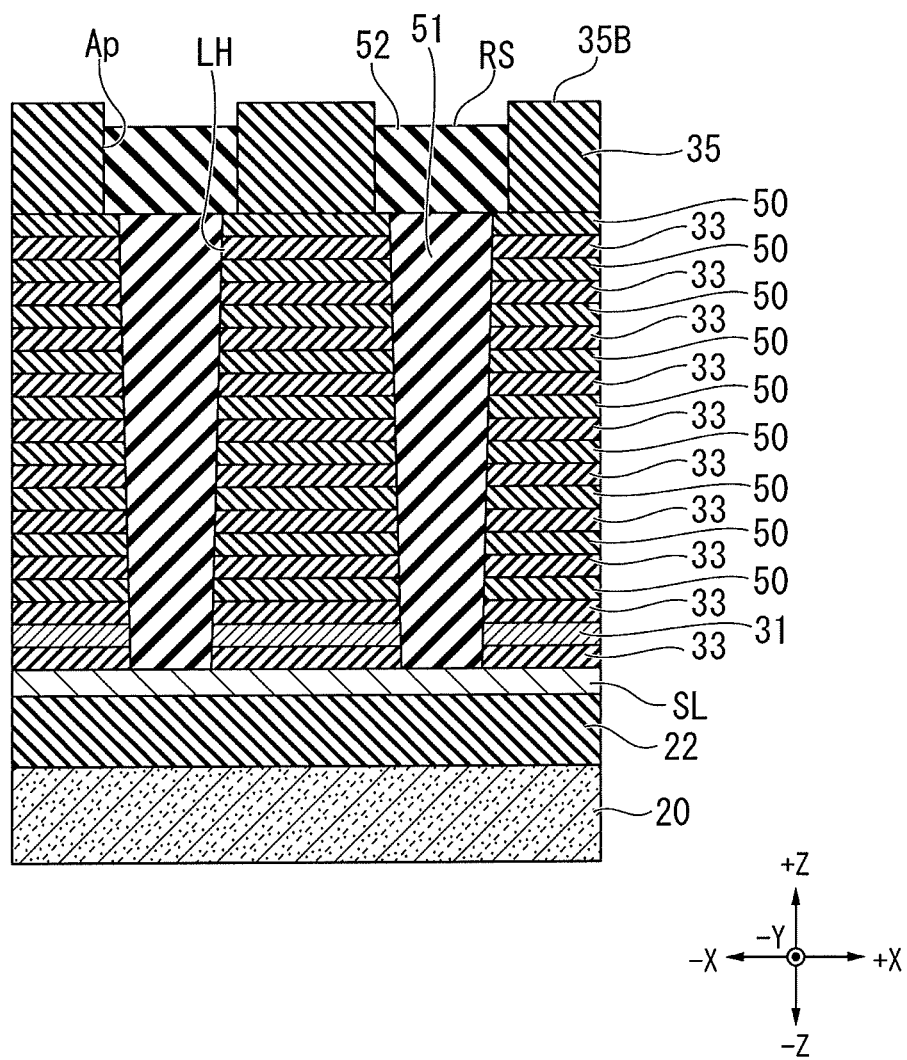
FIG. 14 is a cross-sectional view which shows an example of the manufacturing process of the memory cell array of the first embodiment.

FIG. 14 is a cross-sectional view which corresponds to the concave formation process (S16) shown in FIG. 6. In the concave formation process, the sacrificial material 52 is etched back by RIE. In the present embodiment, the sacrificial material 52 is removed by etching back until a thickness of the sacrificial material 52 in the Z direction becomes thinner than a thickness of the intermediate insulation layer 35 in the Z direction. As a result, a concave RS is formed in the opening Ap.

Figure 15:
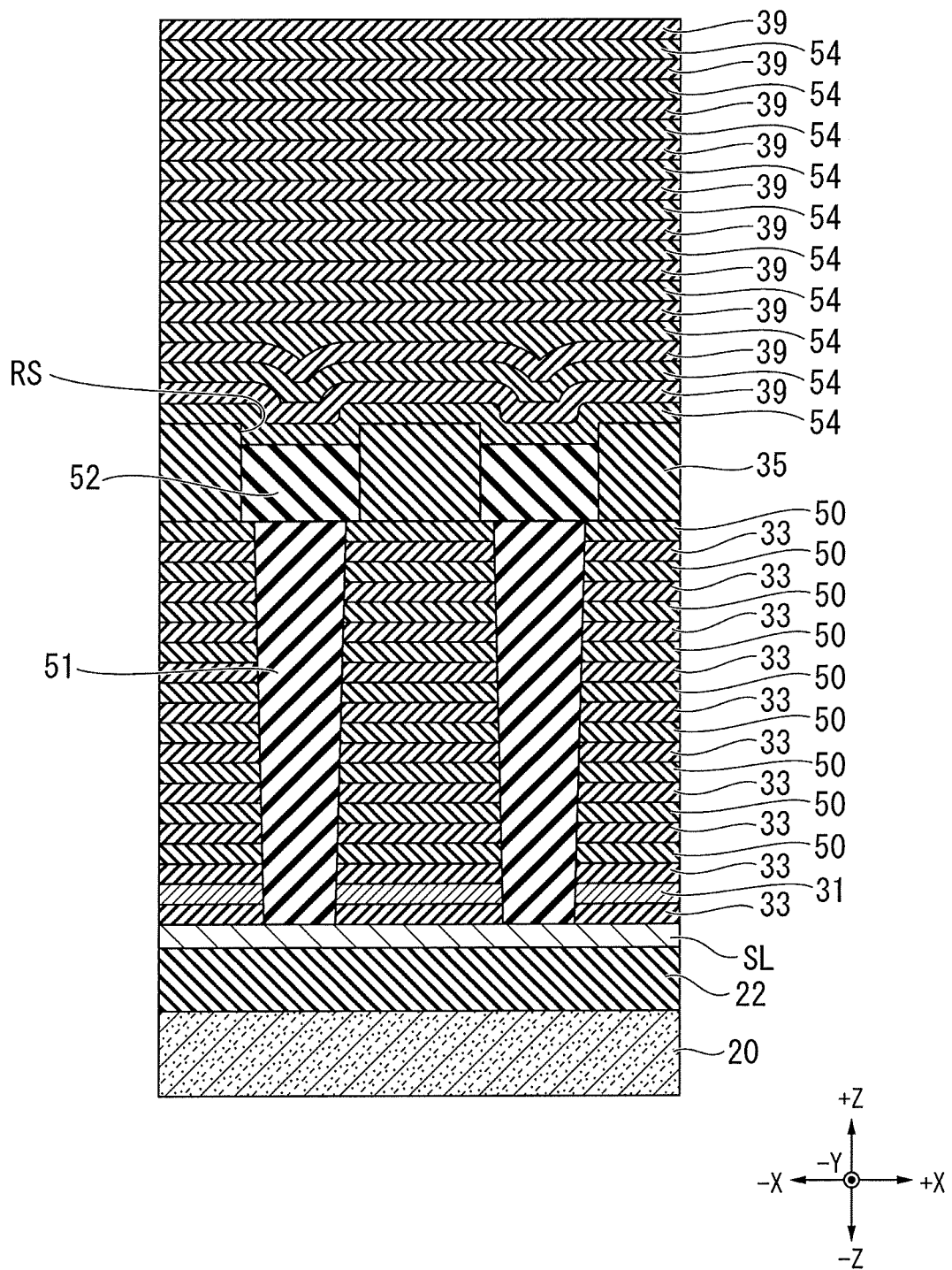
FIG. 15 is a cross-sectional view which shows an example of the manufacturing process of the memory cell array of the first embodiment.

FIG. 15 is a cross-sectional view which corresponds a second lamination process (S17) shown in FIG. 6. In the second lamination process, a substitution material 54 and an insulation layer 39 are alternately laminated on the intermediate insulation layer 35 and the sacrificial material 52. At this time, a part of the lowermost substitution material 54 is provided in the concave RS.

Figure 16:
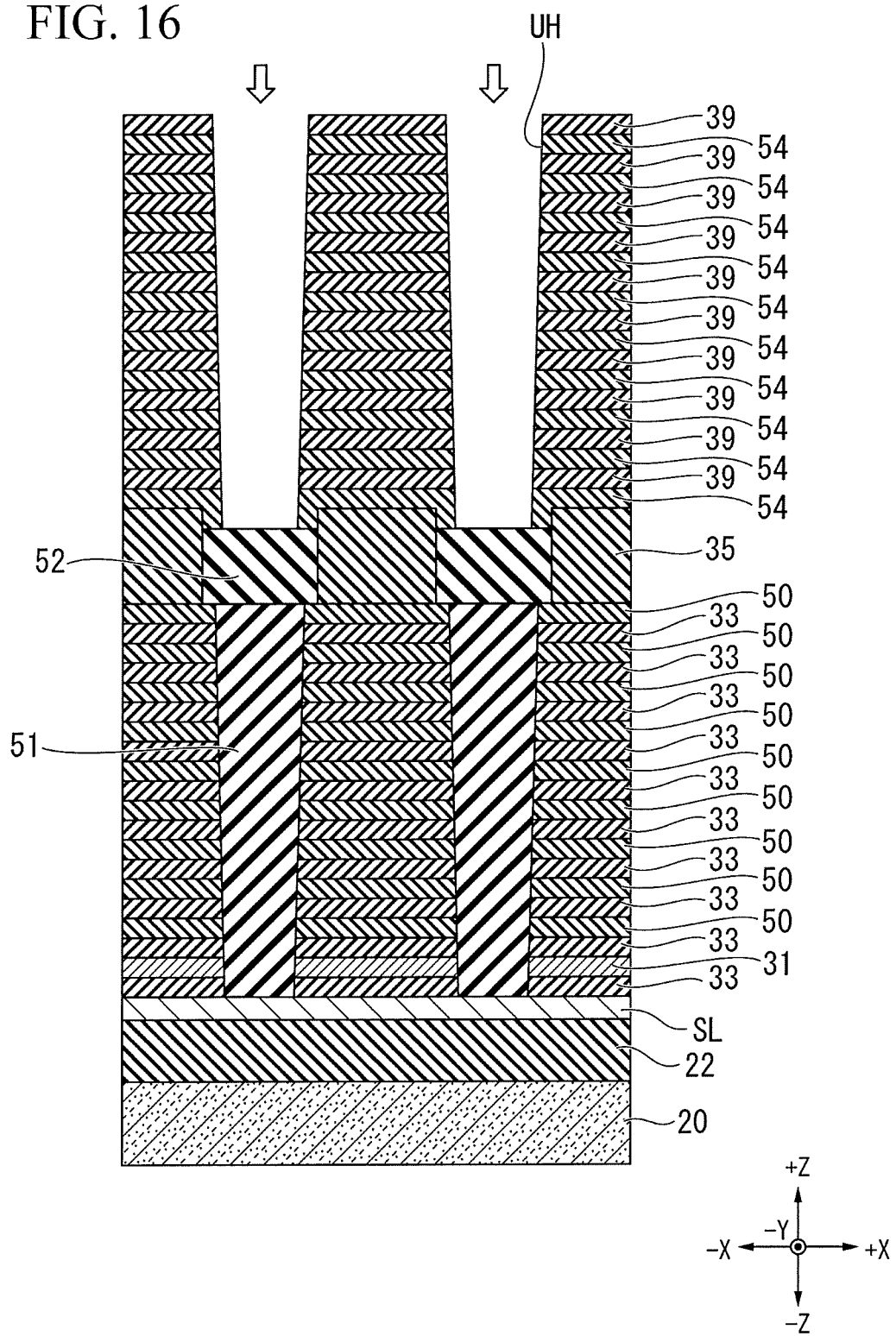
FIG. 16 is a cross-sectional view which shows an example of the manufacturing process of the memory cell array of the first embodiment.

FIG. 16 is a cross-sectional view which corresponds to a second hole processing process (S18) shown in FIG. 6. In the second hole processing process, a hole UH is processed in a laminated body laminated in the process of FIG. 15. The hole UH is processed by photolithography and anisotropic etching. For example, RIE can be used for anisotropic etching. The hole UH reaches an upper surface of the sacrificial material 52.

Figure 17:
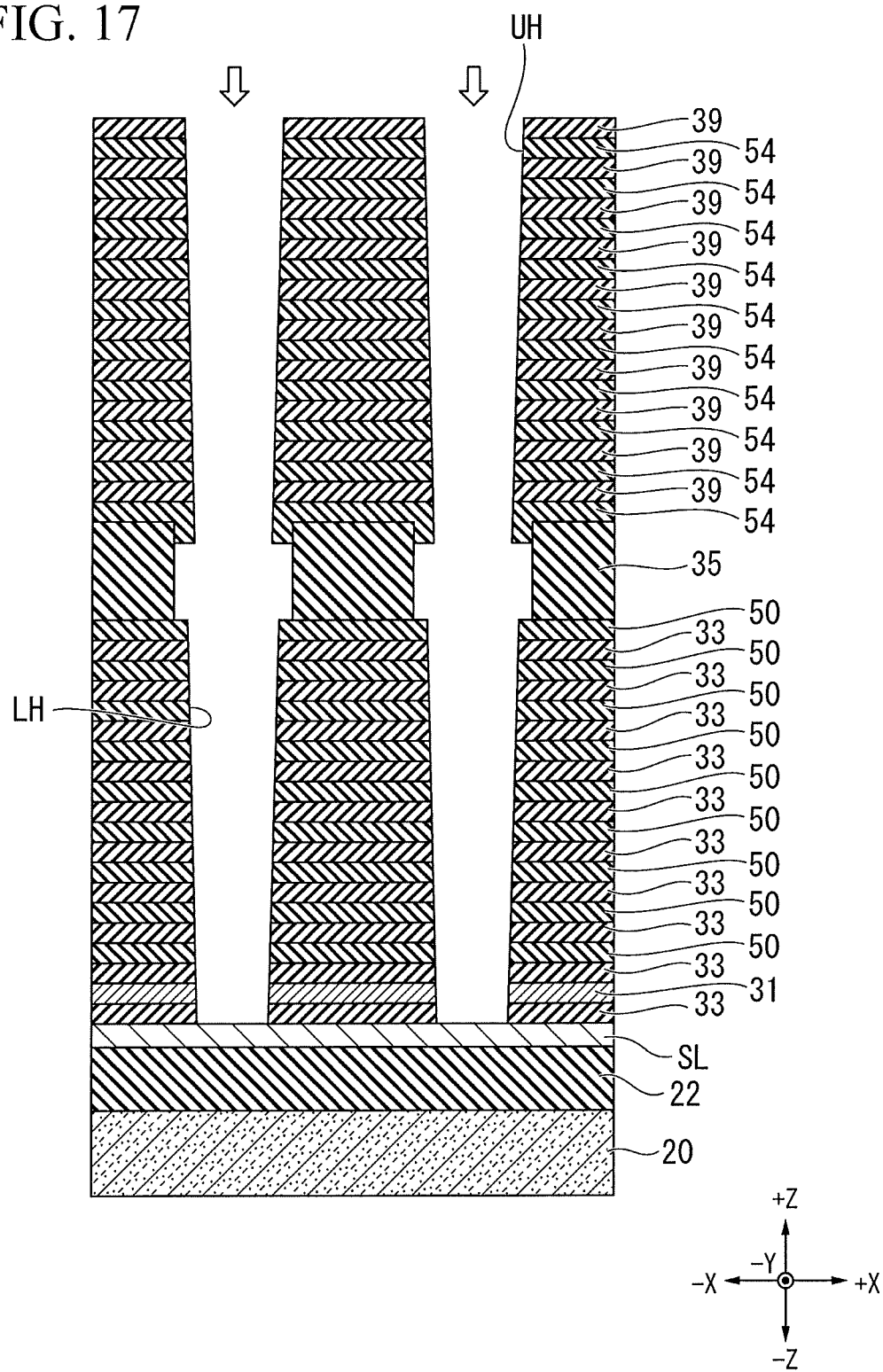
FIG. 17 is a cross-sectional view which shows an example of the manufacturing process of the memory cell array of the first embodiment.

FIG. 17 is a cross-sectional view which corresponds to a sacrificial material removal process (S19) shown in FIG. 6. In the sacrificial material removal process, the sacrificial materials 51 and 52 are removed by wet etching.

Figure 18:
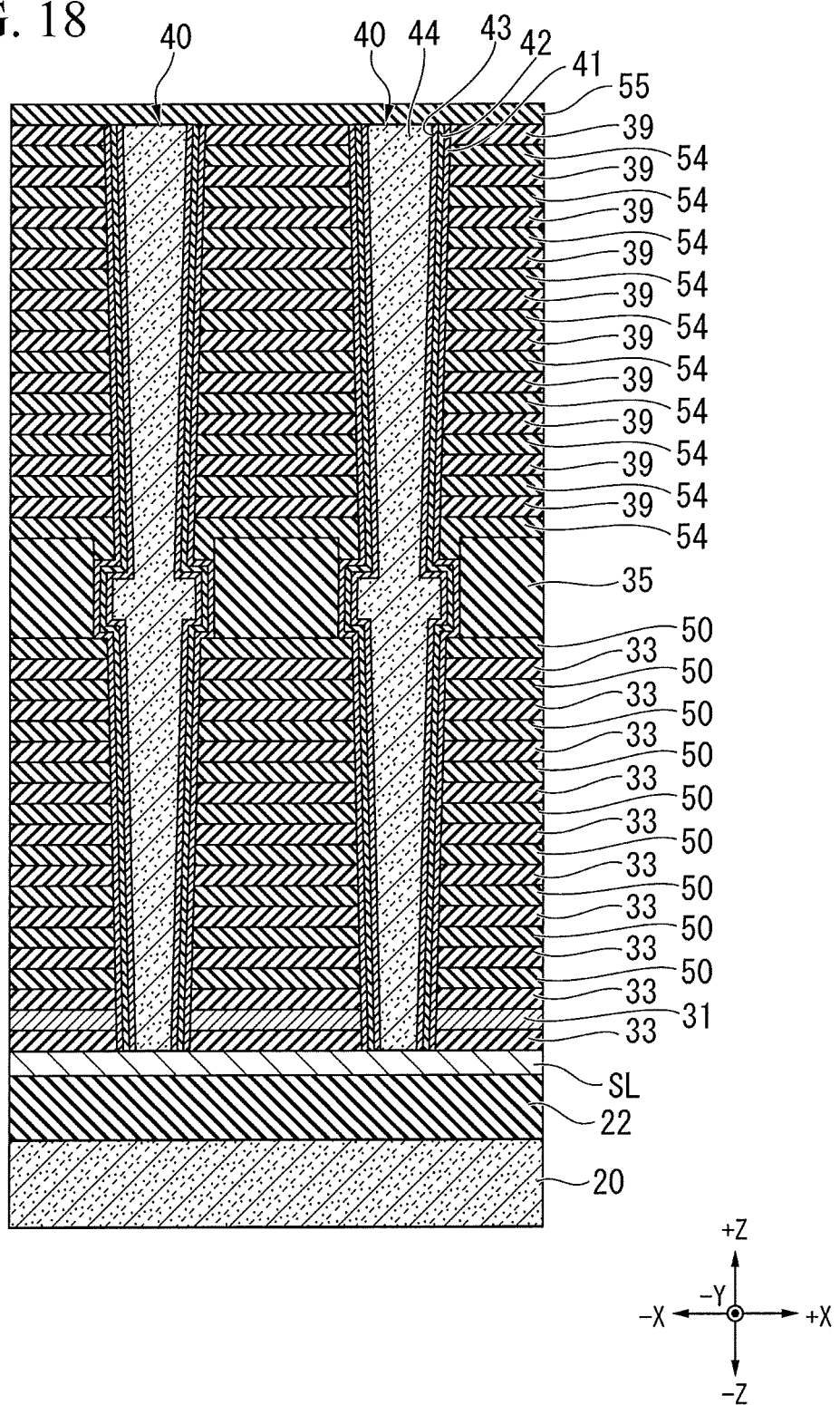
FIG. 18 is a cross-sectional view which shows an example of the manufacturing process of the memory cell array of the first embodiment.

FIG. 18 is a cross-sectional view which corresponds to a columnar body formation process (S20) shown in FIG. 6. In the columnar body formation process, the block insulation film 41, the insulation film 42, the tunnel oxide film 43, and the semiconductor body 44 are laminated on an inner wall of the hole LH and the hole UH to form the columnar body 40. Thereafter, a protection layer 55 is laminated on a top of a laminated body formed in the process up to this point. Then, a slit SLT is formed by a slit processing process. As a result, a plurality of string units SU are divided.

Figure 19:
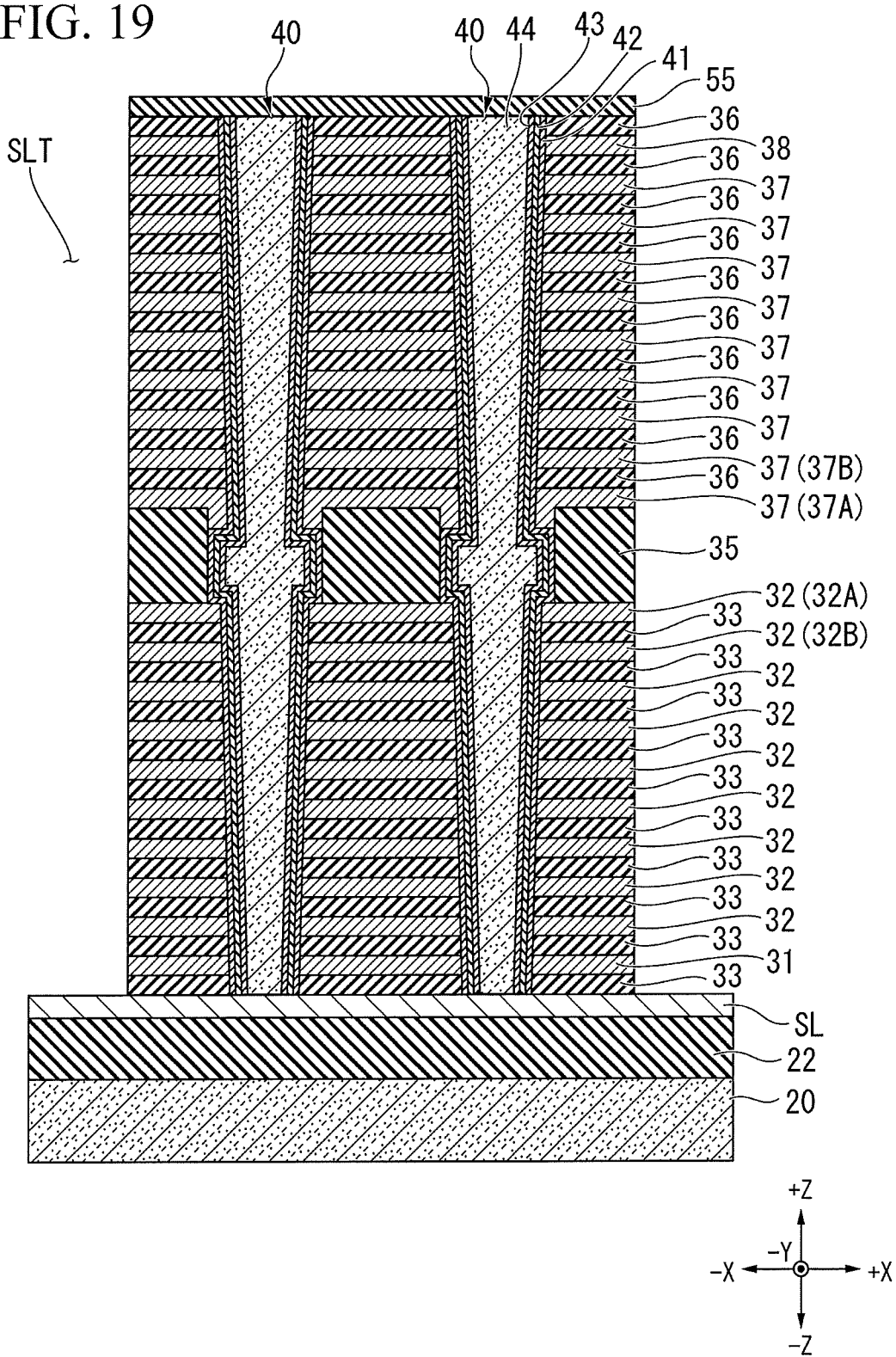
FIG. 19 is a cross-sectional view which shows an example of the manufacturing process of the memory cell array of the first embodiment.

FIG. 19 is a cross-sectional view which corresponds to a replacement process (S21) shown in FIG. 6. In the replacement process, the substitution materials 50 and 54 are removed by wet etching via the slit SLT. Subsequently, a space from which the substitution materials 50 and 54 are removed is filled with a conductive material and the conductive layers 32, 37, and 38 are formed. By the above process, the laminated body 30 and the columnar body 40 are formed. However, a manufacturing method of the semiconductor memory 1 is not limited to the above example.

According to the semiconductor memory device 1 described above, it is possible to reduce power consumption. In the following description, reasons for this will be described.

In order to increase a storage capacity per unit area of a semiconductor memory device, the number of laminated layers of the laminated body 30 is increased. In such a semiconductor memory device, holes LH and UH for forming the columnar body 40 are formed in multiple stages. In this case, for example, in order to suppress occurrence of troubles in the first laminated body 30A even in a case in which there is a positional deviation of a upper hole UH above with respect to a lower hole LH (a positional deviation of the upper hole UH with respect to the opening Ap in which the junction 40C is formed in the present embodiment) occurs, the thickness t3 of the intermediate insulation layer 35 is formed to be thicker than the thickness t1 of the insulation layer 33 of the first laminated body 30A or the thickness t2 of the insulation layer 39 of the second laminated body 30B.

Note that a reason for which the intermediate insulation layer 35 is thick is not limited to the above example, but there may be other reasons.

Here, as a comparative example, a semiconductor memory in which the protrusion part 37Ab is not provided will be considered. In a configuration of such a comparative example, when the intermediate insulation layer 35 which is relatively thick is provided, a part which is relatively far from the conductive layers 32 and 37 in the columnar body 40 is generated. For example, in a case of a semiconductor memory having the junction 40C, a part of the junction 40C is relatively far from the conductive layers 32 and 37. As a result, a fringe electric field applied to the junction 40C from the conductive layers 32 and 37 becomes smaller in the part, and a cell current does not flow through the columnar body 40. For this reason, in the configuration of the comparative example, it is necessary to cause a large current to flow in consideration of a decrease of a cell current, and thus power consumption increases.

On the other hand, in the semiconductor memory 1 according to the present embodiment, the first conductive layer 37A has the protrusion part 37Ab. Even in a case in which the intermediate insulation layer 35 which is relatively thick is provided by providing the protrusion part 37Ab, it is difficult to generate a part which is relatively far from the conductive layers 32 and 37 in the columnar body 40. As a result, it is possible to apply a sufficiently large fringe electric field from the conductive layers 32 and 37 to many parts of the columnar body 40, and a cell current easily flows in the columnar body 40. For this reason, flowing of a large current becomes unnecessary or reduced in consideration of the decrease of a cell current. As a result, it is possible to reduce power consumption.

In the present embodiment, at least a part of the main body part 37Aa is, for example, in contact with the columnar body 40 in the X direction. For this reason, a part of the first conductive layer 37A in contact with the columnar body 40 (a sum of the thickness h1 and the thickness h2 in the Z direction) is wider than parts of the other conductive layers 32 and 37 respectively in contact with the columnar body 40 (the thickness h6 in the Z direction). According to such a configuration, it is possible to apply a fringe electric field to the columnar body 40 over a relatively wide range by the main body part 37Aa and the protrusion part 37Ab. As a result, it is possible to further suppress the decrease of a cell current, and to reduce power consumption.

Second Embodiment

Figure 20:
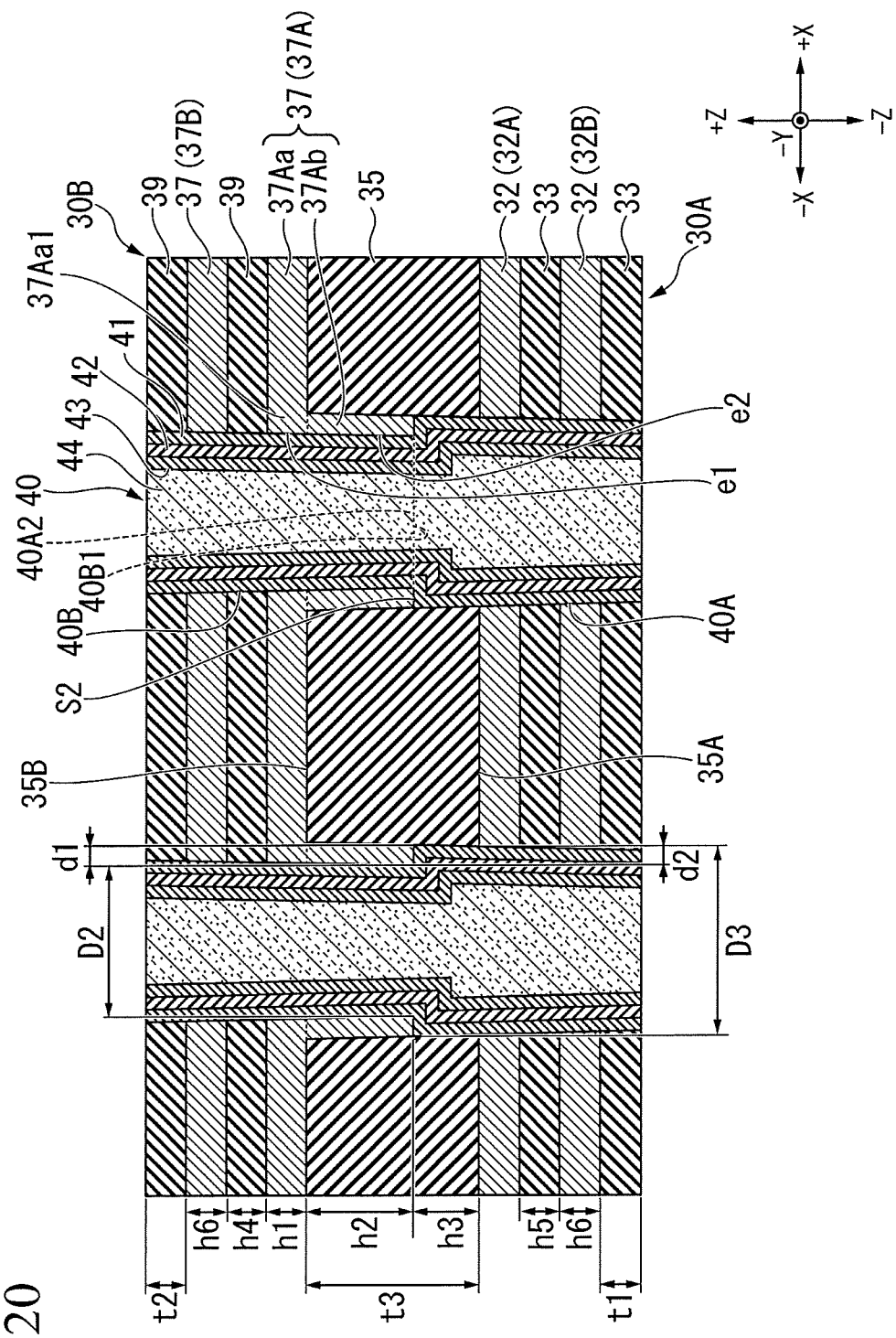
FIG. 20 is a cross-sectional view which shows a partial region of a memory cell array of a second embodiment.

FIG. 20 is a cross-sectional view which shows a partial region of a memory cell array 10 of a second embodiment. The memory cell array 10 of the second embodiment is different from the memory cell array 10 of the first embodiment in a structure of the columnar body 40. Note that configurations other than those described below are the same as in the first embodiment.

In the present embodiment, the columnar body 40 has a first columnar part 40A and a second columnar part 40B.

In the present embodiment, the columnar body 40 does not have a junction 40C. The first columnar part 40A and the second columnar part 40B are in contact with each other in the intermediate insulation layer 35. The first columnar part 40A and the second columnar part 40B are integrally formed, and there is no substantial boundary surface between the first columnar part 40A and the second columnar part 40B.

More specifically, the first columnar part 40A has an upper end 40A2 in contact with the second columnar part 40B. The upper end 40A2 is an example of the "first end." On the other hand, the second columnar part 40B has the lower end 40B1 in contact with the first columnar part 40A. The lower end 40B1 is an example of the "second end." In the present embodiment, widths of the lower end 40B1 of the second columnar part 40B in the X direction and the Y direction are smaller than widths of the upper end 40A2 of the first columnar part 40A in the X direction and the Y direction, respectively.

In the present embodiment, at least a part of the protrusion part 37Ab overlaps the upper end 40A2 of the first columnar part 40A in the Z direction. For example, the protrusion part 37Ab is in contact with the upper end 40A2 of the first columnar part 40A in the Z direction. According to another expression, the protrusion part 37Ab is in contact with the upper end 40A2 of the first columnar part 40A from a side opposite to the first laminated body 30A.

In the present embodiment, the first columnar part 40A and the second columnar part 40B form a step difference S2 at a boundary between the first columnar part 40A and the second columnar part 40B. The step difference S2 is, for example, based on a difference between the width D2 of the lower end 40B1 of the second columnar part 40B in the X direction and the width D3 of the upper end 40A2 of the first columnar part 40A in the X direction. In the present embodiment, the maximum width d1 of the protrusion part 37Ab in the X direction is equal to or smaller than the width d2 of the step difference S2 in the X direction. The "width d2 of the step difference S2 in the X direction" is a difference obtained by subtracting a half of the width D2 of the lower end 40B1 of the second columnar part 40B in the X direction from a half of the width D3 of the upper end 40A2 of the first columnar part 40A in the X direction.

In addition, in the present embodiment, the width d2 of the step difference S2 in the X direction is equal to or smaller than the thickness h1 of the main body part 37Aa in the Z direction. The protrusion length h2 of the protrusion part 37Ab in the Z direction is, for example, equal to or larger than the thickness h1 of the main body part 37Aa in the Z direction. For example, the protrusion length h2 of the protrusion part 37Ab in the Z direction is larger than the thickness h1 of the main body part 37Aa in the Z direction. For example, the protrusion length h2 of the protrusion part 37Ab in the Z direction is equal to or larger than a half of the thickness t3 of the intermediate insulation layer 35 in the Z direction. The protrusion length h2 of the protrusion part 37Ab in the Z direction may be smaller than the thickness h1 of the main body part 37Aa in the Z direction.

Figure 21:
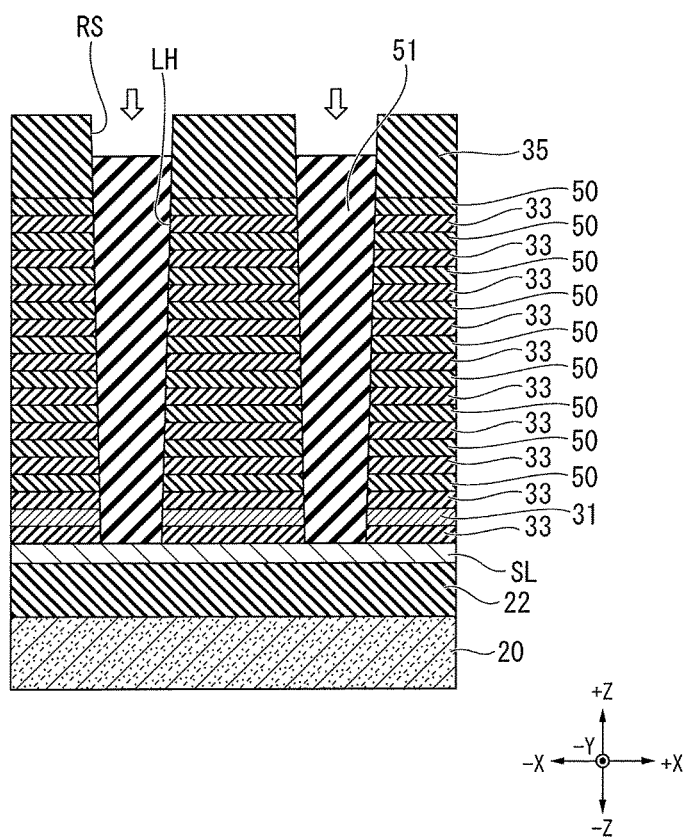
FIG. 21 is a cross-sectional view which shows an example of a manufacturing process of the memory cell array of the second embodiment.

In the manufacturing method of the memory cell array 10 of the second embodiment, first, steps S10 to S13 the same as in the first embodiment will be performed. In the present embodiment, the sacrificial material 51 formed in the hole LH is removed up to an intermediate height position of the intermediate insulation layer 35 in the Z direction in the sacrificial material etch back process of step S13 as shown in FIG. 21. As a result, the concave RS is formed in the hole LH.

Subsequently, steps S14 to S16 are not performed, and steps S17 to S21 are performed in the present embodiment. The processes from step S17 to step S21 are the same as the manufacturing method of the memory cell array 10 of the first embodiment.

According to the semiconductor memory 1 of the second embodiment described above, it is possible to reduce power consumption in the same manner as in the first embodiment. In the present embodiment, since there is no junction 40C, it is easy to increase the protrusion length h2 of the protrusion part 37Ab. If the protrusion length h2 of the protrusion part 37Ab is large, it is easy to apply a sufficient fringe electric field to the columnar body 40. As a result, it is possible to further reduce power consumption.

Third Embodiment

Figure 22:
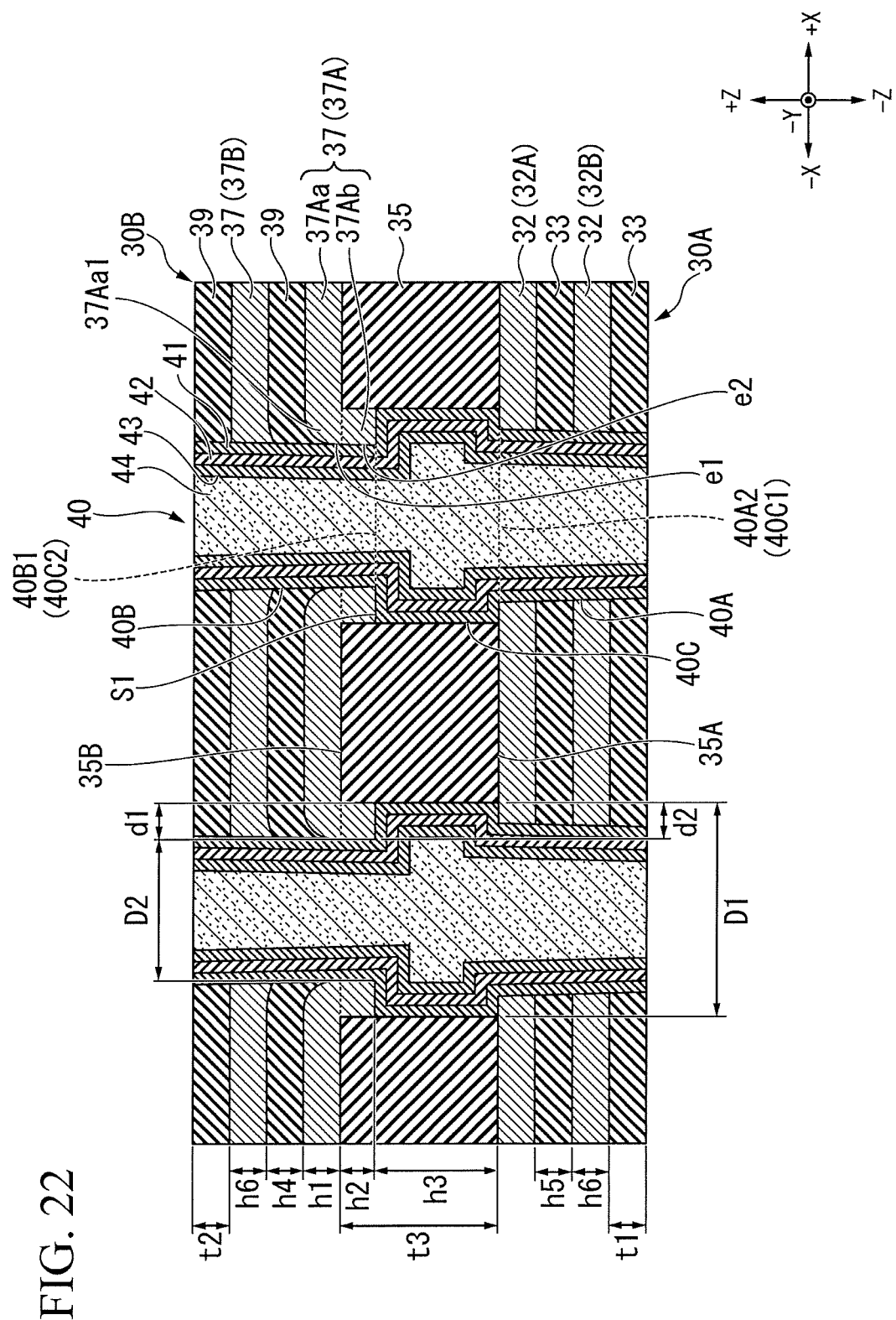
FIG. 22 is a cross-sectional view which shows a partial region of a memory cell array of a third embodiment.

FIG. 22 is a cross-sectional view which shows a partial region of a memory cell array 10 of a third embodiment. In the present embodiment, a shape and the like of the first conductive layer 37A are different from those in the first embodiment. Note that configurations other than those described below are the same as in the first embodiment.

In the present embodiment, at least a part of the main body part 37Aa (the first end 37Aa1) is inclined with respect to the Z direction. For example, the first end 37Aa1 is inclined in a direction approaching the columnar body 40 as proceeding toward the first laminated body 30A. When the first end 37Aa1 is inclined with respect to the Z direction, the first end surface e1 is a surface facing the columnar body 40 at a position closest to the columnar body 40 among end surfaces on the columnar body 40 side of the first end 37Aa1.

In the present embodiment, at least a part of the main body part 37Aa is not in contact with the columnar body 40 in the X direction and the Y direction. A part of one insulation layer 39 (the lowermost insulation layer 39) included in the second laminated body 30B is present between at least a part of the main body part 37Aa and the second columnar part 40B in the X direction and the Y direction. For example, the maximum width d1 of the protrusion part 37Ab in the X direction may be larger than the thickness h1 of the main body part 37Aa in the Z direction. The maximum width d1 of the protrusion part 37Ab in the X direction may also be equal to or smaller than the thickness h1 of the main body part 37Aa in the Z direction.

Figure 23:
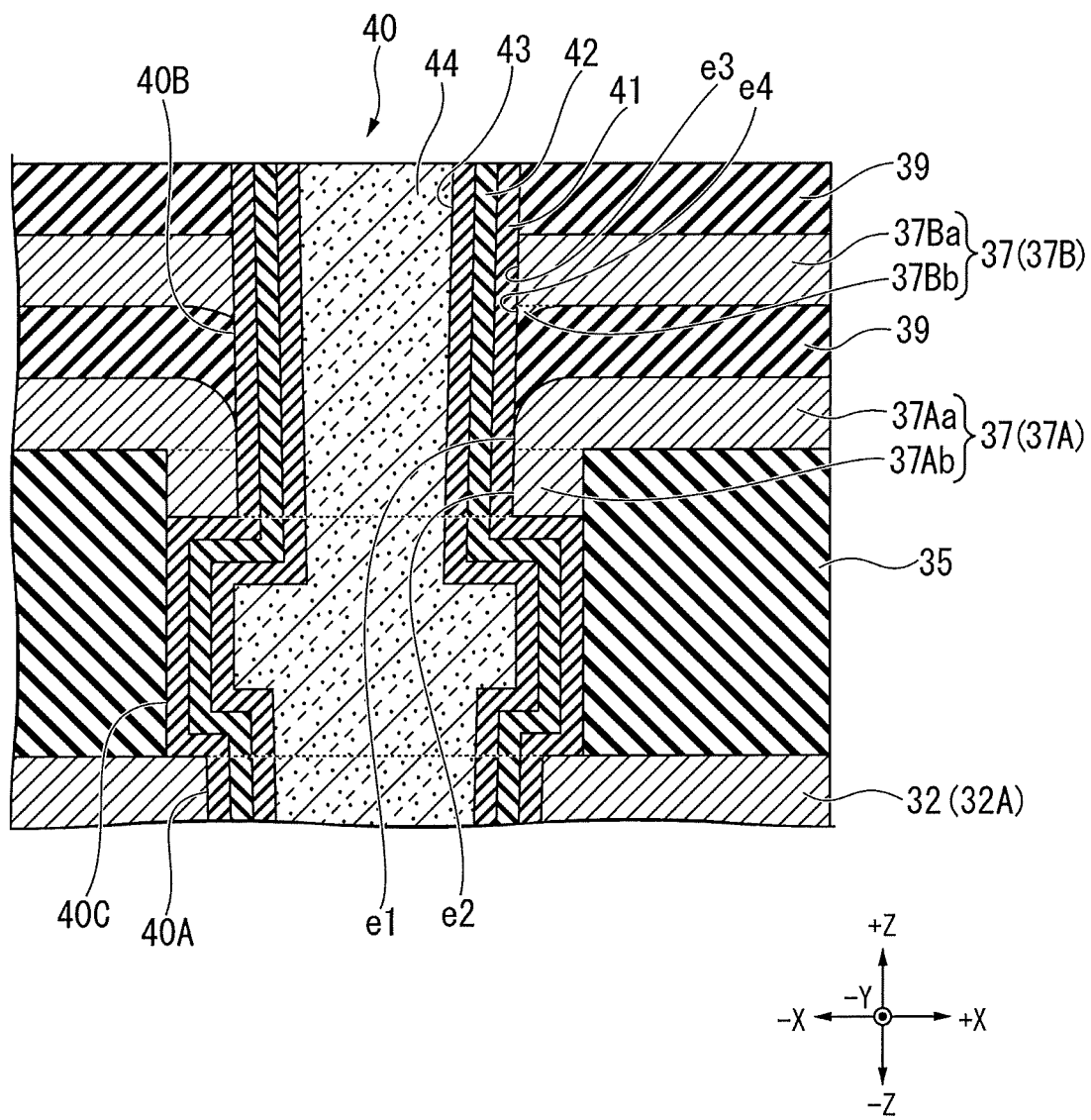
FIG. 23 is a cross-sectional view which shows a further enlarged partial region of the memory cell array of the third embodiment.

FIG. 23 is a cross-sectional view which shows a further enlarged partial region of the memory cell array 10 of the third embodiment. In the present embodiment, the second conductive layer 27B has a main body part (a first part) 37Ba and a protrusion part (a second part) 37Bb. The main body part 37Ba is sandwiched between two insulation layers 39 and extends in the X direction and the Y direction. The protrusion part 37Bb protrudes toward the first laminated body 30A from the main body part 37Ba. The main body part 37Ba has, for example, a third end surface e3 facing the second columnar part 40B in the X direction. The protrusion part 37Bb has, for example, a fourth end surface e4 facing the second columnar part 40B in the X direction.

According to the semiconductor memory 1 of the third embodiment described above, in the same manner as in the first embodiment, it is possible to reduce power consumption. Further, in the present embodiment, at least a part of the main body part 37Aa is not in contact with the columnar body 40, and thereby it is possible to bring a contact area between the first conductive layer 37A and the columnar body 40 closer to a contact area between another conductive layer (for example, the second conductive layer 37B or the third conductive layer 32A) and the columnar body 40 than in the first embodiment. According to such a viewpoint, electrical characteristics of a memory cell transistor MT present in an intersection portion between the first conductive layer 37A and the columnar body 40 can be brought closer to electrical characteristics of a memory cell transistor MT present in an intersection portion between another conductive layer and the columnar body 40. As a result, it is possible to provide a semiconductor memory 1 with enhanced electrical characteristics.

As described above, several embodiments have been described, but the embodiments are not limited to the above example. For example, the main body part 37Aa of the second embodiment may be inclined with respect to the Z direction as in the third embodiment. In addition, the intersection portion between the first conductive layer 37A and the columnar body 40 may also be used as a dummy transistor which is not used for charge accumulation, instead of being used as a memory cell transistor MT.

In the first and third embodiments, a side surface of the junction 40C is vertically shown. However, a shape of the junction 40C is not limited to this. For example, the junction 40C may adopt a barrel type in which the width widens at an intermediate height position in the Z direction or a taper type in which the width continuously increases or decreases.

In addition, an example in which the width decreases as the first columnar part 40A and the second columnar part 40B proceed toward the semiconductor substrate 20 is shown in the first to third embodiments. However, shapes of the first columnar part 40A and the second columnar part 40B are not limited thereto. For example, the first columnar part 40A and the second columnar part 40B may adopt a barrel type in which the width widens at an intermediate height position in the Z direction or a truncated cone type in which the width increases as proceeding toward the semiconductor substrate 20.

In addition, in the first to third embodiments, a case in which the conductive layers 31, 32, 37, and 38 are made of only a conductor is shown as an example. However, the conductive layers 31, 32, 37 and 38 have configurations not limited thereto. For example, the conductive layers 31, 32, 37 and 38 may be configured to have a periphery of the conductor covered with a block insulation film. The block insulation film prevents a back tunneling phenomenon in which charges returns to the insulation film 42 side from the conductive layers 31, 32, 37, and 38. When the conductive layers 31, 32, 37, and 38 have a block insulation film, "the main body part 37Aa and the protrusion part 37Ab being in contact with a columnar body" includes that a conductor constituting the main body part 37Aa and the protrusion part 37Ab is in contact with a columnar body via a block insulation film.

Furthermore, an example in which the first conductive layer 37A and the second conductive layer 37B have the protrusion parts 37Ab and 37Bb is shown in the third embodiment. However, other conductive layers 37 and 38 may also have a protrusion part.

Terms such as "first . . . ," "second . . . " used in the present specification are provided for convenience of description, and may also be referred to by other names.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing form the spirit of the inventions. The accompanying claims and their equivalents are intended to cover such forms or modifications as would fall within the scope and sprit of the inventions.

What is claimed is:

1. A semiconductor memory device comprising:
    a first laminated body including a plurality of conductive layers and a plurality of insulation layers alternately laminated in a first direction;
    a second laminated body provided above the first laminated body and including a plurality of conductive layers and a plurality of insulation layers alternately laminated in the first direction;
    an intermediate insulation layer provided between the first laminated body and the second laminated body and having a thickness in the first direction thicker than that of one insulation layer among the plurality of insulation layers of the first laminated body;
    a columnar body extending in the first direction through the first laminated body, the intermediate insulation layer, and the second laminated body, and including a semiconductor layer;
    a charge accumulation film provided between the semiconductor layer and the plurality of conductive layers of the first laminated body and between the semiconductor layer and the plurality of conductive layers of the second laminated body,
    wherein the columnar body includes a first portion and a second portion provided on the first portion,
    a first width in a second direction crossing the first direction of an upper end of the first portion is larger than a second width in the second direction of the lower end of the second portion,
    the first portion extending through the first laminated body and extending in the intermediate insulation layer,
    the second portion extending through the second laminated body and extending in the intermediate insulation layer,
    a first conductive layer, a lowermost layer among the plurality of the conductive layers of the second laminated body, includes a first part which is provided above the intermediate insulation layer and has a first surface facing the second portion of the columnar body in the second direction, and a second part which protrudes from the first part to the first laminated body, and has a second surface facing the second portion of the columnar body in the second direction, and
    the first end surface and the second end surface are continuous with each other.

2. The semiconductor memory device according to claim 1,
    wherein the second part protrudes closer to the first laminated body than a part of the intermediate insulation layer does.

3. The semiconductor memory device according to claim 1,
    wherein at least a part of the second part is in contact with the columnar body in the second direction.

4. The semiconductor memory device according to claim 1,
    wherein the second part is in contact with the columnar body in the second direction over an entire length of the second part in the first direction.

5. The semiconductor memory device according to claim 1,
    wherein at least a part of the first part is in contact with the columnar body in the second direction.

6. The semiconductor memory device according to claim 1,
    wherein
    a contact area between the first conductive layer and the columnar body is larger than a contact area between a second conductive layer, a second layer from the bottom among the plurality of conductive layers of the second laminated body, and the columnar body.

7. The semiconductor memory device according to claim 1,
    wherein a maximum width of the second part in the second direction is equal to or smaller than a thickness of the first part in the first direction.

8. The semiconductor memory device according to claim 1,
    wherein a protrusion length of the second part in the first direction is equal to or larger than a thickness of the first part in the first direction.

9. The semiconductor memory device according to claim 1,
    wherein
    a shortest distance between the second part and a third conductive layer, an uppermost layer among the plurality of the conductive layers of the first laminated body, in the first direction is substantially equal to or larger than a shortest distance between the first conductive layer and a second conductive layer, a second layer from the bottom among the plurality of conductive layers of the second laminated body, in the first direction.

10. The semiconductor memory device according to claim 1,
    wherein the second part is in an annular shape surrounding the columnar body.

11. The semiconductor memory device according to claim 1,
    wherein the columnar body has a first columnar part having at least a part positioned in the first laminated body, a second columnar part having at least a part positioned in the second laminated body, and a junction which is positioned between the first columnar part and the second columnar part and has a width in the second direction larger than at least a part of the second columnar part, and the second part has a region overlapping a part of the junction when viewed from the first direction.

12. The semiconductor memory device according to claim 11, wherein the second part is in contact with the junction in the first direction.

13. The semiconductor memory device according to claim 11, wherein the second columnar part and the junction form a step difference at a boundary between the second columnar part and the junction, and the maximum width of the second part in the second direction is equal to or smaller than a width of the step difference in the second direction.

14. The semiconductor memory device according to claim 1, wherein the columnar body has a first columnar part having at least a part positioned in the first laminated body and a second columnar part having at least a part positioned in the second laminated body, the first columnar part and the second columnar part are in contact with each other in the intermediate insulation layer, the first columnar part has a first end in contact with the second columnar part, the second columnar part has a second end in contact with the first columnar part and whose width in the second direction is smaller than that of the first end of the first columnar part, and the second part has a region overlapping the first end of the first columnar part when viewed from the first direction.

15. The semiconductor memory device according to claim 14, wherein the second part is in contact with the first end of the first columnar part in the first direction.

16. The semiconductor memory device according to claim 14, wherein the first columnar part and the second columnar part form a step difference at a boundary between the first columnar part and the second columnar part, and the maximum width of the second part in the second direction is equal to or smaller than the width of the step difference in the second direction.

17. The semiconductor memory device according to claim 1, wherein the first part includes a first end adjacent to the columnar body in the second direction, and the first end is inclined with respect to the first direction.

18. The semiconductor memory device according to claim 17, wherein the first end is inclined in a direction approaching the columnar body as proceeding toward the first laminated body.

19. The semiconductor memory device according to claim 17, wherein there is a part of one insulation layer included in the plurality of insulation layers of the second laminated body between at least a part of the first part and the columnar body in the second direction.

* * * * *